(12) United States Patent
Boyd, IV et al.

(10) Patent No.: US 12,104,393 B2
(45) Date of Patent: Oct. 1, 2024

(54) SYSTEMS AND PANELS FOR CUSTOMIZED RETROFIT OF A BUILDING EXTERIOR

(71) Applicant: Branch Technology, Inc., Chattanooga, TN (US)

(72) Inventors: Robert Platt Boyd, IV, Chattanooga, TN (US); David Goodloe, Chattanooga, TN (US); Kenneth M. Lewandowski, Chattanooga, TN (US); Matt Culver, Chattanooga, TN (US)

(73) Assignee: Branch Technology, Inc., Chattanooga, TN (US)

( * ) Notice: Subject to any disclaimer, the term of this patent is extended or adjusted under 35 U.S.C. 154(b) by 0 days.

(21) Appl. No.: 18/104,197

(22) Filed: Jan. 31, 2023

(65) Prior Publication Data
US 2023/0243168 A1     Aug. 3, 2023

Related U.S. Application Data

(60) Provisional application No. 63/305,096, filed on Jan. 31, 2022.

(51) Int. Cl.
*E04B 1/76*          (2006.01)
*B29C 64/386*      (2017.01)
(Continued)

(52) U.S. Cl.
CPC .......... *E04G 23/02* (2013.01); *B29C 64/386* (2017.08); *B33Y 10/00* (2014.12); *B33Y 30/00* (2014.12);
(Continued)

(58) Field of Classification Search
CPC ......... E04G 23/02; E04B 1/38; E04B 1/6812; E04B 1/762; E04C 2002/002
(Continued)

(56) References Cited

U.S. PATENT DOCUMENTS

| 3,252,181 A | 5/1966 | Hureau |
| 4,115,047 A | 9/1978 | Stelmack |

(Continued)

FOREIGN PATENT DOCUMENTS

| AU | 2013202686 A1 | 10/2013 |
| CA | 2928832 A1 | 5/2015 |

(Continued)

OTHER PUBLICATIONS

"ETH Research Project", Gramazio Kohler Research, Etch Zurich 2012-2014, Dec. 12, 2016, 2 pages.
(Continued)

*Primary Examiner* — Brent W Herring
(74) *Attorney, Agent, or Firm* — Kilpatrick Townsend & Stockton LLP

(57) ABSTRACT

Methods, systems, and panels for retrofitting an existing exterior of a building. In one example, the method may include: (a) obtaining data about an exterior geometry of the existing exterior; (b) using the obtained data, defining a custom retrofit panel system for the exterior geometry; and (c) constructing the custom retrofit panel system including a plurality of panels, in which constructing a panel includes: (i) forming a panel frame by additive manufacturing, the panel frame defining interstitial spaces; (ii) at least partially filling the interstitial spaces with at least one filler; and (iii) in which the constructed panel includes a building facing surface configured to mate with the exterior geometry of the existing exterior.

10 Claims, 18 Drawing Sheets

(51) Int. Cl.

| | |
|---|---|
| *B33Y 10/00* | (2015.01) |
| *B33Y 30/00* | (2015.01) |
| *E04B 1/38* | (2006.01) |
| *E04B 1/68* | (2006.01) |
| *E04F 13/072* | (2006.01) |
| *E04F 13/08* | (2006.01) |
| *E04G 23/02* | (2006.01) |
| *G06F 30/13* | (2020.01) |
| *E04C 2/00* | (2006.01) |

(52) U.S. Cl.
CPC .............. *E04B 1/38* (2013.01); *E04B 1/6812* (2013.01); *E04B 1/762* (2013.01); *E04F 13/072* (2013.01); *E04F 13/0875* (2013.01); *G06F 30/13* (2020.01); *E04B 1/7641* (2013.01); *E04C 2002/002* (2013.01)

(58) Field of Classification Search
USPC ........................................................ 52/235
See application file for complete search history.

(56) References Cited

U.S. PATENT DOCUMENTS

| | | | |
|---|---|---|---|
| 4,369,153 A | 1/1983 | Nash et al. | |
| 4,593,449 A | 6/1986 | Meray-Hovarth et al. | |
| 4,593,511 A * | 6/1986 | Hakasaari ............... | E04F 13/10 52/794.1 |
| 4,636,419 A | 1/1987 | Madsen et al. | |
| 4,732,723 A | 3/1988 | Madsen et al. | |
| 4,856,244 A * | 8/1989 | Clapp ..................... | E04C 2/386 52/351 |
| 5,094,051 A * | 3/1992 | Miller ................. | E04F 13/0805 52/235 |
| 5,217,771 A | 6/1993 | Schmanski et al. | |
| 5,266,021 A | 11/1993 | Jacobson | |
| 5,758,464 A * | 6/1998 | Hatton .................. | E04B 1/7675 52/510 |
| 5,764,521 A | 6/1998 | Batchelder et al. | |
| 5,886,702 A | 3/1999 | Migdal et al. | |
| 6,035,583 A | 3/2000 | Papke | |
| 6,170,214 B1 * | 1/2001 | Treister ............... | E04F 13/0808 52/235 |
| 6,214,279 B1 | 4/2001 | Yang et al. | |
| 6,226,942 B1 * | 5/2001 | Bonin ..................... | E04C 2/044 52/309.11 |
| 6,279,293 B1 * | 8/2001 | Ojala ....................... | E04B 7/22 52/95 |
| 6,282,853 B1 * | 9/2001 | Blaney .................... | E04C 2/288 52/223.7 |
| 6,630,221 B1 | 10/2003 | Wong | |
| 6,682,684 B1 | 1/2004 | Jamalabad et al. | |
| 6,936,212 B1 | 8/2005 | Crawford | |
| 7,087,200 B2 | 8/2006 | Taboas et al. | |
| 7,153,454 B2 | 12/2006 | Khoshnevis | |
| 7,424,967 B2 | 9/2008 | Ervin et al. | |
| 7,628,600 B2 | 12/2009 | Perret | |
| 8,113,807 B2 | 2/2012 | Wilkinson | |
| 8,127,507 B1 * | 3/2012 | Bilge .................. | E04F 13/0814 52/235 |
| 8,155,775 B2 | 4/2012 | Batchelder | |
| 8,166,727 B2 | 5/2012 | Pivac et al. | |
| 8,185,240 B2 | 5/2012 | Williams et al. | |
| 8,186,990 B2 | 5/2012 | Perret et al. | |
| 8,337,736 B2 | 12/2012 | Dini | |
| 10,272,613 B2 | 4/2019 | Boyd, IV | |
| 10,307,962 B2 * | 6/2019 | Dessel ............... | H04N 1/00827 |
| 11,415,328 B2 * | 8/2022 | Goldstein ............. | E04F 13/072 |
| 2002/0014051 A1 | 2/2002 | Fraval et al. | |
| 2003/0150179 A1 * | 8/2003 | Moreno ............... | E04F 13/0808 52/235 |
| 2004/0244344 A1 | 12/2004 | Ichikawa | |
| 2005/0072113 A1 | 4/2005 | Collins et al. | |
| 2007/0138678 A1 | 6/2007 | Khoshnevis | |
| 2007/0160820 A1 | 7/2007 | Waters, Jr. | |
| 2008/0128956 A1 | 6/2008 | Perret | |
| 2008/0148683 A1 | 6/2008 | Dini et al. | |
| 2008/0155919 A1 * | 7/2008 | Keshishian ............. | E04C 2/049 52/690 |
| 2008/0196349 A1 * | 8/2008 | Gonzalez ................ | E04B 2/845 52/693 |
| 2010/0086721 A1 | 4/2010 | Batchelder | |
| 2011/0209438 A1 * | 9/2011 | Keshishian ............. | E04C 2/049 52/694 |
| 2012/0174511 A1 * | 7/2012 | Harding ................ | E04D 13/064 294/93 |
| 2013/0037984 A1 | 2/2013 | Arnauts | |
| 2013/0101746 A1 | 4/2013 | Keremes et al. | |
| 2013/0266793 A1 * | 10/2013 | Robertshaw ............. | E04B 2/86 428/223 |
| 2015/0132535 A1 * | 5/2015 | Hazenbrink ............. | E04C 2/34 428/137 |
| 2016/0001508 A1 * | 1/2016 | Dessel ............... | H04N 1/00827 425/135 |
| 2016/0263822 A1 * | 9/2016 | Boyd, IV ................ | B32B 27/00 |
| 2017/0217088 A1 | 8/2017 | Boyd, IV et al. | |
| 2019/0211557 A1 * | 7/2019 | Moghaddam ............. | E04B 2/62 |
| 2020/0250280 A1 * | 8/2020 | Chopson ................ | G06F 30/13 |

FOREIGN PATENT DOCUMENTS

| | | |
|---|---|---|
| DE | 102005062406 A1 | 6/2007 |
| DE | 202006019940 U1 | 9/2007 |
| DE | 102007063561 A1 | 7/2009 |
| DE | 102013105341 A1 | 11/2014 |
| EP | 3063341 | 9/2016 |
| EP | 3063341 A4 | 4/2017 |
| IT | UB20159259 A1 | 6/2017 |
| WO | 2004083540 A2 | 9/2004 |
| WO | 2010019051 A1 | 2/2010 |
| WO | 2011021080 A2 | 2/2011 |
| WO | 2015034438 A1 | 3/2015 |
| WO | 2015065936 A2 | 5/2015 |
| WO | 2015065936 A3 | 6/2015 |

OTHER PUBLICATIONS

"Mesh Mould", Gramazio Kohler Research, Available online at: http://gramaziokohler.arch.ethz.ch/web/e/forschung/221.html, 2012-2016, 2 pages.

U.S. Appl. No. 15/032,791, "Non-Final Office Action", Oct. 18, 2017, 10 pages.

U.S. Appl. No. 15/032,791, "Non-Final Office Action", Apr. 10, 2018, 12 pages.

U.S. Appl. No. 15/032,791, "Notice of Allowance", Dec. 12, 2018, 15 pages.

U.S. Appl. No. 15/032,791, "Restriction Requirement", Jul. 28, 2017, 8 pages.

U.S. Appl. No. 15/488,218, "Non-Final Office Action", Mar. 14, 2019, 25 pages.

Amaral et al., "Towards a Robust Solution in Building Automation Systems: Supporting Rapid Prototyping and Analysis", 2012 Eighth International Conference on the Quality of Information and Communications Technology, 2012, 4 pages.

Ceccanti et al., "3D Printing Technology for a Moon Outpost Exploiting Lunar Soil", 61st International Astronautical Congress, vol. 11, 2010, 9 pages.

Craveiro et al., "Functionally Graded Structures Through Building Manufacturing", Advanced Materials Research, 2013, pp. 775-778.

De Grassi et al., "Development of an Automatic Four-color Spraying Device Carried by a Robot Arm", Proceedings of the 24th International Symposium on Automation and Robotics in Construction, 2007, 6 pages.

European Application No. 14859196.9, "Communication Pursuant to Rule 114(2) EPC", Dec. 21, 2016, 4 pages.

European Application No. 14859196.9, "Extended European Search Report", Mar. 22, 2017, 7 pages.

Griffith et al., "Computing & Materializing Non-Uniform Shapes", The Association for Computer-Aided Architectural Design Research in Asia: Rhythm and Harmony in Digital Space, 2006, pp. 227-235.

(56) References Cited

OTHER PUBLICATIONS

Gu et al., "3D Hierarchically Parametric Design Method for Cast-in-Place Concrete Structures", Journal of Computer Aided Design & Computer Graphics, vol. 22, No. 12, Dec. 2010, 21 pages.

Hack et al., "Overcoming Repetition: Robotic Fabrication Processes at a Large Scale", International Journal of Architectural Computing, vol. 11, No. 3, 2013, pp. 285-299.

Khoshnevis, "Extending RP to Large Scale Fabrication—Automated House Construction", IIE Annual Conference and Exhibition 2004, 2004, 1 page.

Ko et al., "Development of Automatic Reinforcement Bar Placement for RC Walls Based on Structural Building Information Modeling (S-BIM)", Advanced Materials Research, vol. 711, 2013, pp. 623-628.

Lim et al., "Developments in Construction-Scale Additive Manufacturing Processes", Automation in Construction, vol. 21, No. 1, Jan. 2012, pp. 262-268.

Moum et al., "What Did You Learn From Practice Today? Exploring Experiences From a Danish R&d Effort in Digital Construction", Advanced Engineering Informatics, vol. 23, No. 3, Jul. 2009, pp. 229-242.

International Application No. PCT/US2014/062514, "International Preliminary Report on Patentability", May 12, 2016, 7 pages.

International Application No. PCT/US2014/062514, "International Search Report and Written Opinion", Mar. 4, 2015, 8 pages.

Pottmann et al., "Geometry of Multi-Layer Freeform Structures for Architecture", International Conference on Computer Graphics and Interactive Techniques, 2007, 11 pages.

Rael et al., "Developing Concrete Polymer Building Components for 3D Printing", Proceedings of the 31st Annual Conference of the Association for Computer Aided Design in Architecture, 2011, pp. 152-157.

Reed, "3D Printing in the Architectural-Engineering-Construction Market", Rapid 2011 and 3D Imaging Conferences and Exposition, 2011, 9 pages.

Ruan et al., "Direct Three-Dimensional Layer Metal Deposition", Journal of Manufacturing Science and Engineering, Transactions of the ASME, vol. 132, No. 6, Dec. 2010, pp. 064502-1-064502-6.

Sass, "Synthesis of Design Production with Integrated Digital Fabrication", Automation in Construction, vol. 16, No. 3, May 2007, pp. 298-310.

Song et al., "Development of a Bim-Based Structural Framework Optimization and Simulation System for Building Construction", Computers in Industry, vol. 63, No. 9, 2012, pp. 895-912.

Mllalon et al., "Breaking Down Brick Walls: Design, Construction, and Prototype Fabrication Knowledge In Architecture", Proceedings of the 27th International Conference Extended Abstracts on Human Factors in Computing Systems, 2009, 8 pages.

Zhang et al., "Optimal Machine Operation Planning for Construction by Contour Crafting", Automation in Construction, vol. 29, Jan. 2013, pp. 50-67.

Zhou et al., "Discussion of the Construction Design Methodology Considering Both Evolutionary Structural Optimization and 3D Printing Technology", Applied Mechanics and Materials, vol. 275-277, 2013, pp. 2616-2619.

International Application No. PCT/US2023/012046, "International Search Report and Written Opinion", Jun. 26, 2023, 12 pages.

* cited by examiner

SYSTEMS AND PANELS FOR CUSTOMIZED RETROFIT OF A BUILDING EXTERIOR

CROSS REFERENCE TO RELATED APPLICATIONS

This patent application claims priority to and the benefit of the filing date of U.S. Provisional Patent Application Ser. No. 63/305,096 filed Jan. 31, 2022, the entire contents of which are incorporated by this reference.

RELATED FIELDS

Construction-scale additive manufacturing (3D printing), building energy retrofits, and exterior wall panels, including scanning and design of geometries, panel manufacturing, and connection and installation methods.

BACKGROUND

In 2021, the operation of buildings accounted for 30% of global energy consumption. The building envelope is the single largest contributor to primary energy use in residential and commercial buildings. In the United States, it is estimated that 11% of total primary energy use can be attributed to the opaque envelope of buildings. Because of the outsized impact that the building envelope has on energy consumption, it is crucial to enable energy retrofits of existing buildings to improve their energy efficiency. And because approximately 93% of residential and 60% of commercial buildings that exist today will still exist in 2050, retrofit technologies are critical to reduce the built environment's impact on carbon emissions for the next 30 years.

Existing building energy retrofits include methods to: (1) "drill and fill" insulation where insulation is injected into wall cavities through small holes, (2) overcladding with expanded polystyrene insulation manually applied on-site on top of a building's existing facade, and (3) overcladding using prefabricated insulated panels that are installed on an exterior facade. This disclosure discusses innovations in the third category of retrofit methods described above.

Insulated energy retrofit systems for the opaque building envelope typically require disruptive, invasive, and expensive on-site work, including setup, scaffolding, demolition, substrate-wall preparation, panel cutting and customization, panel installation, and clean-up of created waste. The cause of such an involved installation process is the current framework used for installing such energy retrofit methods—applying flat sheet goods to complex three-dimensional building wall surfaces. These sheet goods have planar surfaces that must attach to the substrate wall of the building. But, very few of the buildings needing energy retrofits have flat, planar substrate walls. Buildings have custom or otherwise irregular or non-planar geometries on their exterior facades that complicate the retrofit process when using traditional methods and materials because these walls must be normalized to a planar surface to accept current state-of-the-art retrofit products.

Additive manufacturing, or 3D printing, is a customizable fabrication process that has been in use for several decades in various industries and has seen adoption at construction scale in the last 10 years. This patent application references previous innovations in this category under U.S. Pat. No. 10,272,613 B2, the entire contents of which are hereby incorporated by reference. Additive manufacturing is a mass-customization framework that can be used in at least some implementations to create a standardizable method by which to create custom geometries. This is in distinct opposition to mass production processes which are standardized methods for producing identical products. As such, additive manufacturing is uniquely suited to address the challenges of geometric customization needed to adapt a standard solution to the incredible variation of existing buildings. With an appropriate suite of highly insulating materials that can be processed in a digital additive manufacturing workflow at construction scale and in a prefabricated environment, incredible advances in the opaque-wall energy retrofit industry can be achieved.

SUMMARY

The terms "invention," "the invention," "this invention," and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim. The headings herein are provided for ease of reference and likewise are not intended to identify key or essential features and are not intended to limit the scope of the claimed subject matter.

This patent application describes a system of panels that may be used for the energy efficient retrofit to existing buildings, among other uses. The system may include panels with all the following attributes: lightweight, composite, insulating, digitally produced, prefabricated, geometry conforming, structural, bespoke, finished panel system for quickly overcladding an object in a non-disruptive manner, principally existing buildings which can be a code compliant, fire rated, panel system which can increase the energy efficiency of old buildings and give them new life for another generation.

Because the panel system is using the cellular matrix product of Branch Technology's patent U.S. Pat. No. 10,272,613 B2 the panels are lightweight, structural, composite, prefab and insulating. In addition to these aspects the panel system herein are manufactured to produce resulting panel attributes that mate precisely with an existing building's geometry, are quickly installed because of the system of hardware, and are non-disruptive to existing building occupants. Additionally the process of digital geometry acquisition to physical installation may be automated through the system.

This patent application describes examples of methods for designing, manufacturing, and installing a prefabricated, insulating energy retrofit panel system for exterior opaque walls of existing buildings. At least some of the examples provide for a unique approach to defining the geometric boundary conditions of manufactured panels through 3D scanning and 3D printing, the process of translating that geometry into printable panels, the architectural, mechanical, and connection details of the panel system itself, and the installation and sealing process.

At least some implementations of this technology provide the ability to enable the digitization and mass customization of a class of products whose manufacturing has previously been entirely based on paper documents, physical measurements, manual labor, and disconnected workflows. Digital manufacturing is the process of fabricating physical products from digital information sources. Those digital information sources may, however, be man-made or "hand-drawn" in computer aided design (CAD) environments. A true digitally native retrofit process can capture real-world facade geometry through 3D scanning and an automated 3D-model-building system that can process real-world geometry data in a point cloud and convert it into a high fidelity 3D model such as a surface or a mesh. This model that has been digitally captured and converted can now also be used to physically and automatically manufacture a panel system through 3D printing. Branch Technology's Cellular Fabrication (C-Fab®) process is one example of a 3D printing process that combines additively manufactured structural lattices with infilling materials that insulate, reinforce, and fireblock. This process is capable of capturing the real-world geometry data and incorporating it into the backplane of the fabricated panels to create a custom surface that fits like a glove around the existing facade's features and abnormalities. Lightweight synthetic finish materials may then be applied to the front surface of the panel exterior to create an architectural finish that is durable and aesthetic. When applied as an overclad to an existing building's facade, this composite assembly is a high-performing energy retrofit that can greatly enhance the building's operational energy efficiency.

In some implementations of the present invention, the panel seams and associated connection hardware are configured in a unique and advantageous manner. The form of the panels and the internal hardware at the panel seams may be configured to enable attachment to the building wall without the use of a previously installed subframe or rail system. Additionally, a single panel can be removed or installed without the need to remove adjacent panels.

3D Scanning

The source of truth for most traditional construction projects before digital technologies existed was hand measurement. This is still the case for traditional retrofit projects. This allows human error to be introduced into shop drawings, blueprints, or fabrication plans. 3D scanning may be used as a way to capture geometric data that may inform the backplane surface of panels to be fabricated as part of this system. LIDAR scanning, photogrammetry, or other 3D scanning techniques can create a digital model with varying resolution that can be manipulated in a CAD environment to produce 3D models. 3D models historically were only helpful for visualization and verification, but with the onset of digital manufacturing technologies like those described in U.S. Pat. No. 10,272,613 B2, 3D models can replace shop or fabrication drawings in many cases. 3D scanning a building's existing facade to capture the geometry that will then be 3D printed into the backplane of an exterior overclad retrofit is a new approach. In some implementations of the present invention, a method includes digitally converting these point cloud scans into manufacturing data for the bespoke panel production.

Digital Production

Digital production is the process of taking the raw scanned geometry and turning that into files used to physically produce the system. The point cloud data may be translated into mesh or planar digital geometry useful in CAD systems for 3D modeling that can then be manipulated to create the backplane of the panels system. A new feature surface is created by offsetting the existing building plane away from the building plane to create the desired panel and insulation thickness. This insulated shell is then sub-divided into a series of panels that are sized for the manufacturing, transportation, structural loading, and installation requirements. This panelization works around existing building openings like windows, doors, or other apertures that must remain. The new outer skin of the building may also be designed to mirror the existing building's geometry, may be completely flat, or may be designed with a completely new look. Once design and panelization are complete, structural analysis can be performed to verify the panels can span between support points and that the building can take the imposed loads at the support locations. This may result in some re-sizing of panels to accommodate structural requirements. After final panelization is complete, the series of hardware and attachment points are configured and added to each panel assembly along with the required back of panel pockets which integrate the hardware into the panel system. Ultimately this produces final digital geometry for each panel which incorporates the custom backplane configured to the existing building geometry, new feature face, manufacturing instructions for the attachment hardware and any incorporated reinforcements, robotic code for 3D printing, robotic code for infilling with foam insulation, robotic code for milling the back plane to the required geometry for each panel, and robotic code for finishing instructions. This may result in a series of code instructions for each robot accomplishing its portion of the work. The digital production system also includes the on-site installation sequence that associates all hardware and connections necessary for panel installation on the existing building with that panel. It may also be used to sequence the loading and unloading of the transport method such that the first panel off the truck is the panel needed to be installed first on the building.

Manufacturing

Some of the examples described herein encompass a mass-customized process using 3D printing, robotic infilling of high-R-value insulation, and robotic milling to prefabricate panels that fit like a glove or otherwise conform onto a building's substrate wall with complex geometries without requiring preparatory demolition or surface normalization. The 3D printing process leverages the freeform 3D printing technology of U.S. Pat. No. 10,272,613 B2 to create a cellular matrix that is a lightweight structural lattice with interstitial spaces that can be filled with other materials like insulation. The insulation in-filling process is done robotically and can be thought of as an additive manufacturing process itself—injecting shots of foam that expand and fill the volume of the printed lattice in an automated fashion to create a solid volume part that is structural, highly insulating, and fire resistant. The printed and foamed parts are then milled robotically to remove the top layer of expanded foam that swells beyond the printed lattice structure. This process retraces the original boundaries of the printed volume, with an appropriate offset distance to allow complete encapsulation of the printed lattice by the foam insulation. This step also allows for higher resolution capturing of geometric details for the mass customization of the panel's backplane based on the scans of the building's geometry. For example, if a thin window sill geometry needs to be accounted for in the backplane geometry of the printed panel, the milling robot may carve that thin shape out of the back of the panel if it was too thin or detailed to be captured during the 3D printing process. Once the panels have been printed, foamed, and milled, the scanned geometry is fully captured and the only remaining steps are to finish the panels with a lightweight synthetic stucco architectural finish and to install hardware connection mechanisms. The finishing lamina may be applied manually to the outside of the completed panels to achieve an architectural finish that sheds water, protects the wall from impacts, and provides the desired aesthetic. Many other finish systems may also be applied to the panel system to provide a fully finished panel system. Mechanical attachments are affixed to the panels at the appropriate connection and hoisting points so that the panels can be shipped to the jobsite and attached directly to the building with the integrated hardware.

Connection and Installation

A prefabricated wall panel system that digitally and physically matches an existing building is of benefit, but to take advantage of the benefits of prefabrication and minimize the disruption and time for on-site installation the system may include embedded hardware that may accomplish the following: adapt to the geometric deformation and features of the existing building; structurally attach to a building without compromising the existing building structure; be lightweight enough to be borne by the existing structure; enable fast installation on site; eliminate pre-work required to install the system on the existing building; eliminate measure and install steps by the panel system self spacing and exactly matching the existing building features and geometry; adapt to the application over multiple building materials; have an integral method to lift and install the panels from one hardware system; allow for thermal movement of the existing building and the panel system itself; provide for a gravity loading location and lateral loading locations that can slide freely as the building or panel system has thermal movement; allow for the free draining of moisture and water at the existing building face; allow an individual panel to be removed or replaced without having to deinstall a sequence of panels to repair or have access to the existing building; and be simple, intuitive, and fast to install on site. With a wall panel system that may accomplish all of these functions, it may eliminate the very long and expensive on-site labor currently associated with existing building retrofits. The embedded panel hardware system illustrated herein may accomplish all or any combination of the above purposes.

A bottom of facade rail is installed on the building that sets the height and depth for that entire face of the building. The rail is structurally attached through the existing building facing material and fastened into the building's structure. The rail is set off the existing building by a certain amount to allow water to freely drain out if there was leakage in the new panel system. This bottom rail is the gravity loading point for the bottom row of panels. Attachment hardware is embedded into the wall panel that fits into the bottom rail and sets the height and spacing for the installation of the next row of rails. The upper rail is attached to the top of the panel as it is lifted into place and the panel height sets the spacing of its attachment onto the existing building, thereby eliminating the measurement step to install subsequent panels and rails in the system. This upper rail of the panel is the lateral connection that allows for thermal movement in the system. This upper rail has depth adjustment mechanisms to adapt to the existing building surface irregularity and maintain a new planar front of panel feature face. The series of rails could also be pre-installed on the building through measuring and installing prior to the panel installation, but there are many advantages of time and money if they are installed sequentially as panels are installed.

An additional hardware system is also illustrated which includes embedded hardware internal to the panel seams that acts as both a method of attachment and adjustment. Each panel is mechanically fastened to the existing building using the horizontal attachment hardware. The horizontal attachment hardware also provides adjustment in terms of aligning a panel face with adjacent panels and enables a panel to accommodate inconsistent surfaces of an existing building wall. An inclusion for vertical clip hardware, internal to the horizontal joints between panels, mechanically connects panels to one another so that when panels are set, they lock together. However, this hardware can be disengaged allowing an individual panel to be extracted without removing adjacent panels. Reversing this process would allow an individual panel to be installed without the need to remove adjacent panels.

An integrated gasket system may be pre-attached to the panels edges that allow for the system to be weathertight upon installation, rather than having a subsequent step of manually sealing each panel joint with backer-rod and sealant. The seams are sealed with the panels' integrated gasket system at the perimeter. This system is designed to both prevent entrance of bulk water but also to provide for drainage should water enter the cavity behind the panels. Once the panels are installed on the building, the hardware at the seams allows for adjustment. This system of sealing panel seams may be removed should an individual panel need to be extracted for repair or replacement.

Summary Conclusion

Whereas most overcladding retrofit panels systems are customized by hand on-site, the subject invention system arrives at the job-site completely customized already to the exact geometric dimensions of the existing building's facade geometry. The digital manufacturing process captures all geometric features and defects in the existing facade—including window sills, soffits, architectural ornamentation, chipped bricks, drip edges, building settling, material bowing, wall deformation, material erosion, material rot, and any other non-planar or abnormal surface undulations. In addition, the panels are lightweight due to the shape and geometry-optimized 3D printing process that uses minimal material to print a defined volume. Depending on panel depth, the entire system can weigh from 2-5 lbs per square foot of wall area. These lightweight panels can then be attached to the building rapidly and easily with an integrated standoff hardware system that allows for lifting, mounting, spacing, attaching, and removal through an integrated all-in-one hardware attachment system to existing building substrates, even with custom back-side panel geometries. The result is a digitally manufactured energy retrofit that is rapidly deployable and decreases operational building energy consumption through improved thermal performance and energy retention. The described panels are more thermally insulating than traditional overclad prefabricated insulating panels because of the high-performance infill and the higher-tolerance enclosure of the building through fabricating a custom back-plane that more effectively surrounds the building's surface area. In addition, the front side of the retrofit panel system may have a customized geometry for architectural or ornamental effect.

This panel system may also be used to repair a portion of an existing building that may have fallen off, rotted, or deteriorated with a similar wall panel system to the one described herein, but the panel edges may be milled and finished to fit an exact representation of the damaged area.

This panel system may also be directly attached to the exterior surface of an existing building using construction adhesives. This may be possible because the panel system weight is light enough on top of some existing building finishes that the attachment hardware back to the building structure is not needed or that the existing building structure is the exterior face of the existing building.

This system may also be used on new buildings.

This system may also be applied to unique objects like a ship, rock, car, tree, packaging, logistic systems, piping, pressure vessel, industrial equipment, acoustic wall, acoustic ceiling, seating, furniture, or other objects that may benefit from having a new enclosure system.

An alternative method of supporting the panels may be to add a foundation element at the base of the existing building and each of the panels added to the face of the existing building are supported one on top of the other down to the added foundation. In this way the panels are only attached back to the existing building for lateral loads, but no additional gravity loads are added to the existing building structure.

BRIEF DESCRIPTION OF THE FIGURES

Illustrative embodiments of the present invention are described in detail below with reference to the following drawing figures.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangements of elements is explicitly described.

Figure 1:
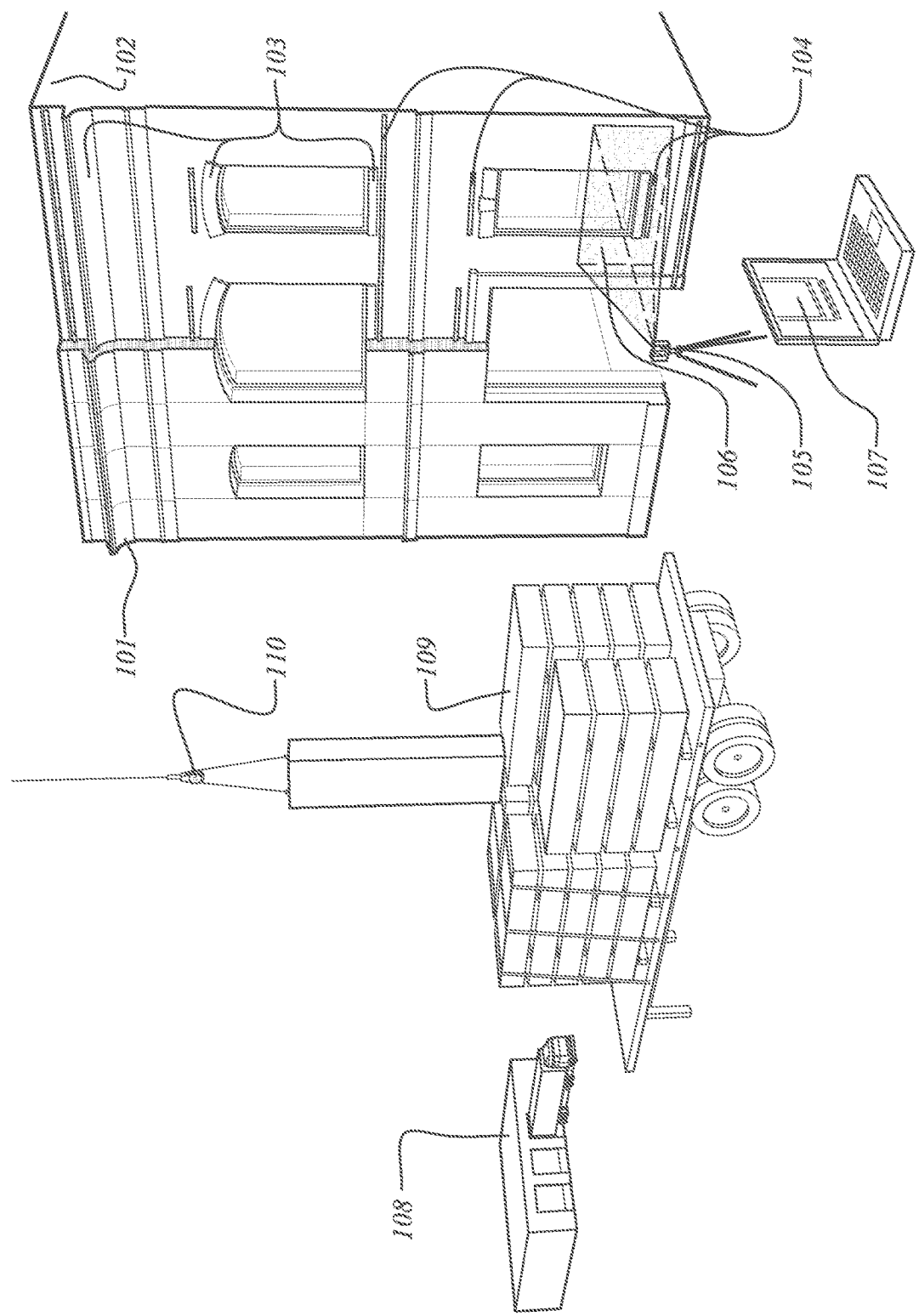
FIG. 1 is a perspective view illustrating an overview diagram of a system of panels attached to an existing building.

In some embodiments, e.g., as depicted in FIG. 1, a system of wall panels 101 is attached to a building 102 which has certain features 103 protruding or recessed on the building facade 106. While some embodiments describe the attachment of the system of wall panels 101 to the existing exterior of building, e.g., the building facade 106, it is understood that the system of wall panels 101 may be attached to an existing interior of a building 102 as well. Attachment rails 104 are spaced at appropriate locations to attach panels 101 to the building. Prior to panel fabrication, a digital scanner 105 is used to scan the building facade 106 in such detail as to produce a digital model 107 that is then produced in factory 108 through the freeform 3D printing technology of U.S. Pat. No. 10,272,613 B2. The prefabricated system of panels 109 are then shipped to the project site and installed on the building with lifting mechanism 110.

Figure 2:
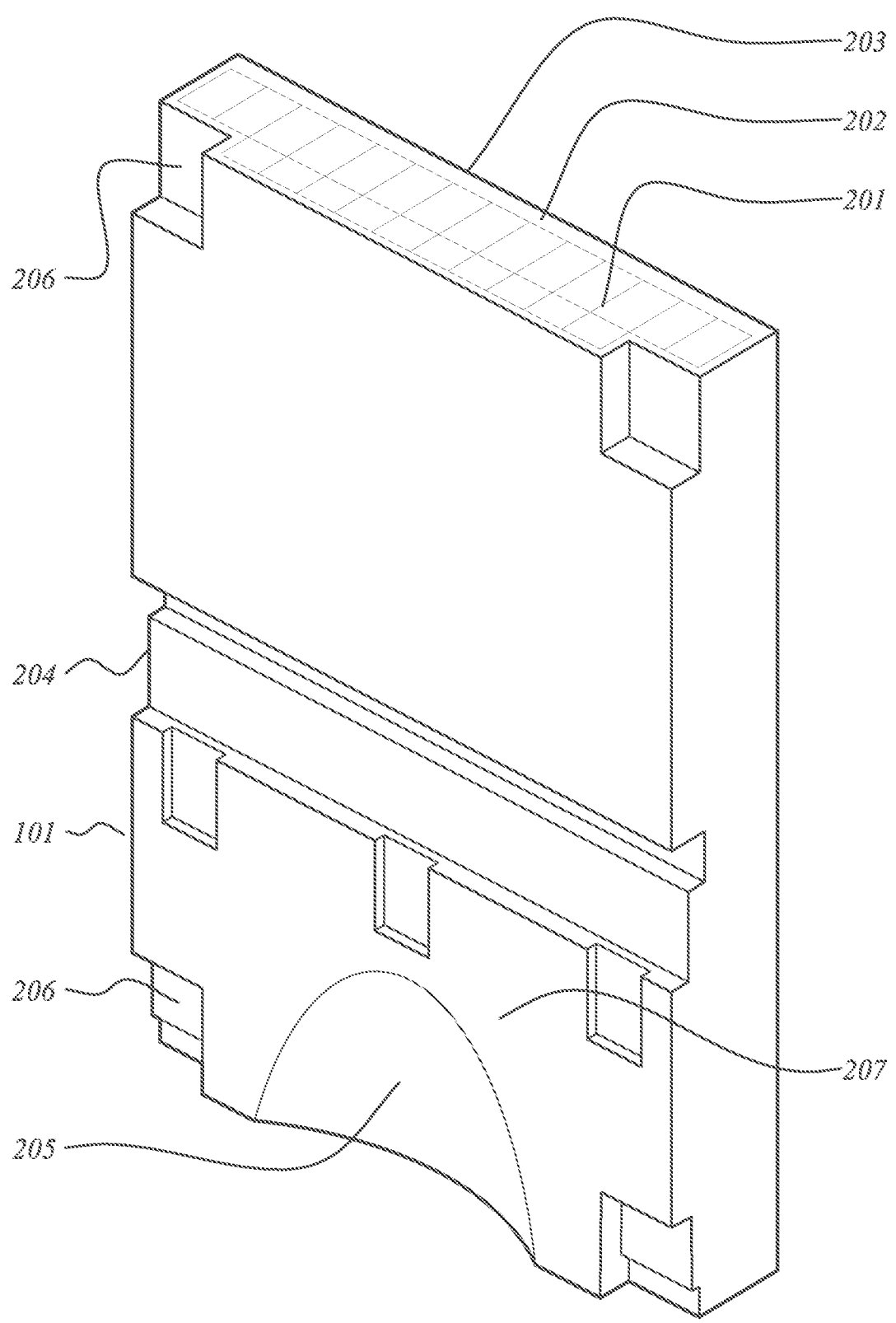
FIG. 2 is an axonometric view illustrating the back plane of one panel of the system.

FIG. 2 illustrates the back plane 207 of one panel 101 and certain features that may be included in one panel 101 of the system. The wall panel 101 is a cellular matrix 201 with an infill material 202 and exterior face finish 203. The cellular matrix 201 may be produced in a freeform 3D printing manner, e.g., as discussed in U.S. Pat. No. 10,272,613 B2, with various polymers such as a fiber reinforced Acrylonitrile Butadiene Styrene ("ABS") or fiber reinforced polycarbonate. In certain embodiments, the infill material 202 of the cellular matrix 201 may be a spray foam insulation 202 that flows in and around all of the polymer struts to create a composite structure that may then be milled down robotically. The back plane 207 of panel 101 may have certain features 204 of the scanned building and other pockets 206 that may integrate attachment locations into the panel 101 to be secured to the building 102. Other features such as bowed face 205, may incorporate deformations, settlement, or out of plane movement of the existing building 102 over time and that may be incorporated into the back plane 207 of the panel 101.

A variety of materials may be used for and incorporated into the cellular matrix 201 and infill material 202, e.g. as discussed in U.S. Pat. No. 10,272,613 B2. In some embodiments, the cellular matrix 201 may be a carbon fiber reinforced polycarbonate and then may be infilled with an infill material 202 of a two-part, high R-value, polyurethane, spray foam insulation that has an intumescent agent. The exterior finish 203 may be a lightweight stucco finish system and the back plane 207 may be the exposed spray foam insulation.

Figure 3:
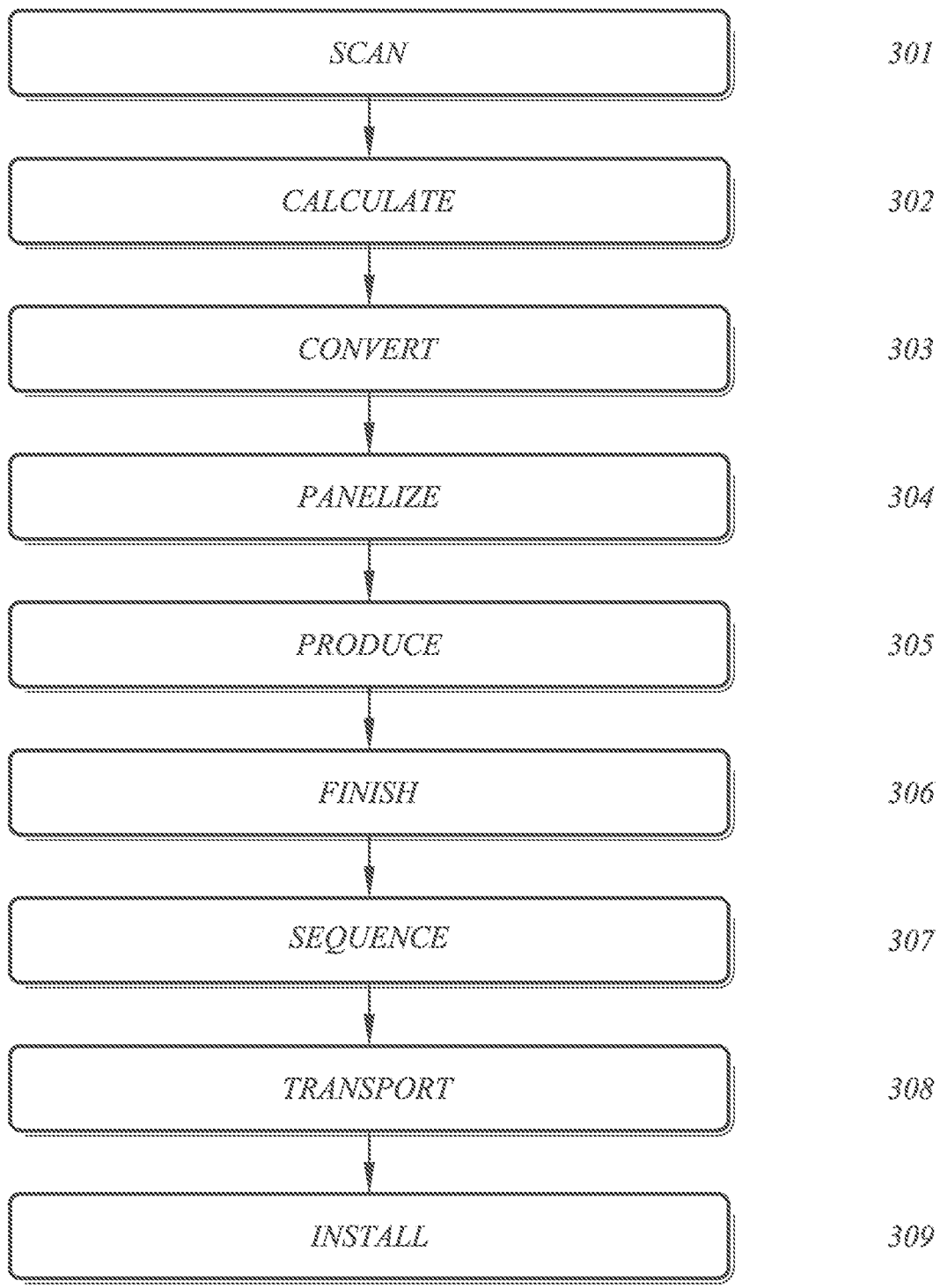
FIG. 3 shows exemplary steps within one embodiment of the system.

FIG. 3 is a panel system 310 logic flow diagram. This is a basic, exemplary overview of steps that may be taken to produce and install wall panels 101. Numerous substitutions, alterations, modifications, omissions and the like may be possible and desirable depending on the existing building facade 106, the nature of the wall panels 101 being fabricated, the materials being used, the nature of the installation, etc. It is understood that certain steps of the panel system 310 may be done in a different order than what is described herein.

The panel system 310 may start with a digital scan 301 of an existing building using a LiDAR scanner, which produces an accurate digital point cloud model of the building. Other methods of acquiring a digital model of the building such as photogrammetry, ultrasound, infrared, drone scanning, or manual measurement may be employed. The digital scan 301 may be used to capture the existing building's size, detailed features, window and door openings, exterior mounted equipment or conduit, building settlement or cracks, out of plane deformation, fire damage, car or tree crash damage, general construction inconsistencies, etc. The digital scan may produce a digital model of the building that may be used in further steps of the panel system 310.

Once an initial digital model of the building is obtained, the panel system 310 may calculate 302 various outcomes once the full system is installed. Historical building energy usage can be obtained with a projected monthly, annual, and long term energy savings that may be calculated based on various options such as panel thickness, insulation value, or finish system. This will result in a system cost based on the options selected which can then be used to calculate a Return on Investment to determine which features to select in the system. Additional calculations 302 may produce a financing model with incorporated carbon offset, green, or government incentives and projected financing rates for how the building owner may pay for the system all at once or over time. The outcome of this step could be the decision for the building owner to incorporate the system on their building and engage the company to start production.

After the building owner decides to incorporate the panel system on their building, the initial digital scan 301 is converted 303 into a high fidelity digital model used to create the panel system parts and components. This step may incorporate methods to use the initial LiDAR point cloud as the digital production model or it may convert the point cloud to a mesh or nurbs based digital model. The various existing building components are documented and coordinated such as the existing building exterior material of masonry, stone, wood, stucco, or siding; power, telecom, gas, water, and rainwater raceways; HVAC units, vents, ductwork, and piping; window and door openings and details; egress systems of stairs, sidewalks, or ladders, and any other components mounted on the existing building that need to remain. Additionally new components that will be incorporated after the wall system is installed are also incorporated into the final digital model which may include integrated photovoltaic system, sun shading architecture, planters, through wall or integrated HVAC systems, or any other systems that may be incorporated into the panel system. The outcome of this step will be the source of truth for the panel system, which incorporates all existing and new systems that are incorporated into the walls or exterior skin of the building.

After the conversion 303 and coordination to create the high fidelity digital model, the system may panelize 304 the overall building skin into individual panels. Each panel is a smaller part of the overall system and the exterior of the panel will incorporate the particular back plane geometry of the existing building, the building components that need to be coordinated at that location, the integrated panel hardware locations, and the selected geometry of the finished front face of the system. Interior to each panel the system creates the components for attachment onto the building, internal raceways, the machine instructions to create the 3d printed polymer matrix, infilling material deposition, robotic milling, and finishing. The outcome of this step is full digital or manual instructions to create each panel of the system.

The production 305 of the panel system may be accomplished with a cellular matrix product, mechanisms, and process of U.S. Pat. No. 10,272,613 B2. Additional portions of the production may incorporate the attachment system. As a final step to produce 305 the panel system, the panels are finished 306 in one embodiment with a lightweight, synthetic stucco finish system. This finish system contains a multi-step, multi-component, layered finish system that produces a consistent finish appearance and depth. Other finish systems that can be incorporated may include, EPDM, PVC, TPO, HDPE, HIPS, methyl methacrylate, micro-cement, ultra high performance concrete, glass fiber reinforced concrete, fiberglass, or other thin or lightweight finishes. All of these finish systems may be applied using a manual buildup/application method or become an automated system through spray, pour, dip, trowel, print, vacuum forming, thermoforming, or other methods to apply the finish system to the panels.

The sequencing 307 step involves the virtual assembly of the panels on the building and what sequence parts and pieces may be installed. Sequencing 307 involves the application of the components or work that must be accomplished prior to installation, installation of base rails; lifting and erection sequence of panels; working around building components, constraints, openings, doors, windows, flashing; mid-building rail installation and top-building rail installation. The sequencing 307 step produces the order that parts must be installed on site so that the transportation 308 method may arrive on-site in proper sequence to be taken off the truck in the order the wall panel system may be installed onto the building facade. This means that the last panels on the truck will be the first off the truck and onto the building.

The install 309 step installs the panel system on the building in the sequence 307 so that the install time is as efficient as possible. The install 309 step starts with the installation of the bottom rail, which may set the height and depth of the rest of the wall system and sequential panel installation thereafter. Once the bottom rail is set the first panel may be set upon the bottom rail and then secured at the proper depth on the upper panel edge. With the setting of the top of the first panel, the second row rail height and depth is set from the wall face. This upper rail sets the height and depth of the bottom of the panels that are installed in the row above. Adjacent bottom panels are installed in sequence until the bottom row of panels is complete and each panel upper rail sets the height and depth for the next row up the building. Each row is completed in sequence from either a left or right hand direction and then moving up the building to next highest rows.

Another sequence could be to start at a corner and build up in a pyramidal fashion where the corner panels are installed first and then incrementally built up like a pyramid with one side starting in a left to right manner and the mirrored corner starting right to left.

With this wall system being a digitally derived model, digital production method, and sequential install process, accuracy can be integrated into the system that would only be available through digitally precise means, with a potential outcome being that no measurement is necessary to complete the system installation after the bottom rail is set. With the panel system being a digitally precise wall assembly that matches the existing building like a jigsaw puzzle piece, it is a potential outcome that no measurement would be needed on-site. A system of this nature could be installed faster and with less skilled labor than other building retrofit systems.

In some embodiments, the attachment system may incorporate the top and bottom rail assemblies, tripping, and lifting points into the panel hardware in an integrated manner. In certain embodiments, the attachment system could be installed with components similar to other more conventional rainscreen systems. In some embodiments, the attachment system may include the setting of horizontal rails at each row, but the height and depth is set when panels are installed and can be locked into place with a movable locking mechanism.

Panel system 310 steps may be performed in this sequence or other combinations that may incorporate additional systems or eliminate certain steps to adapt to certain applications.

Figure 4:
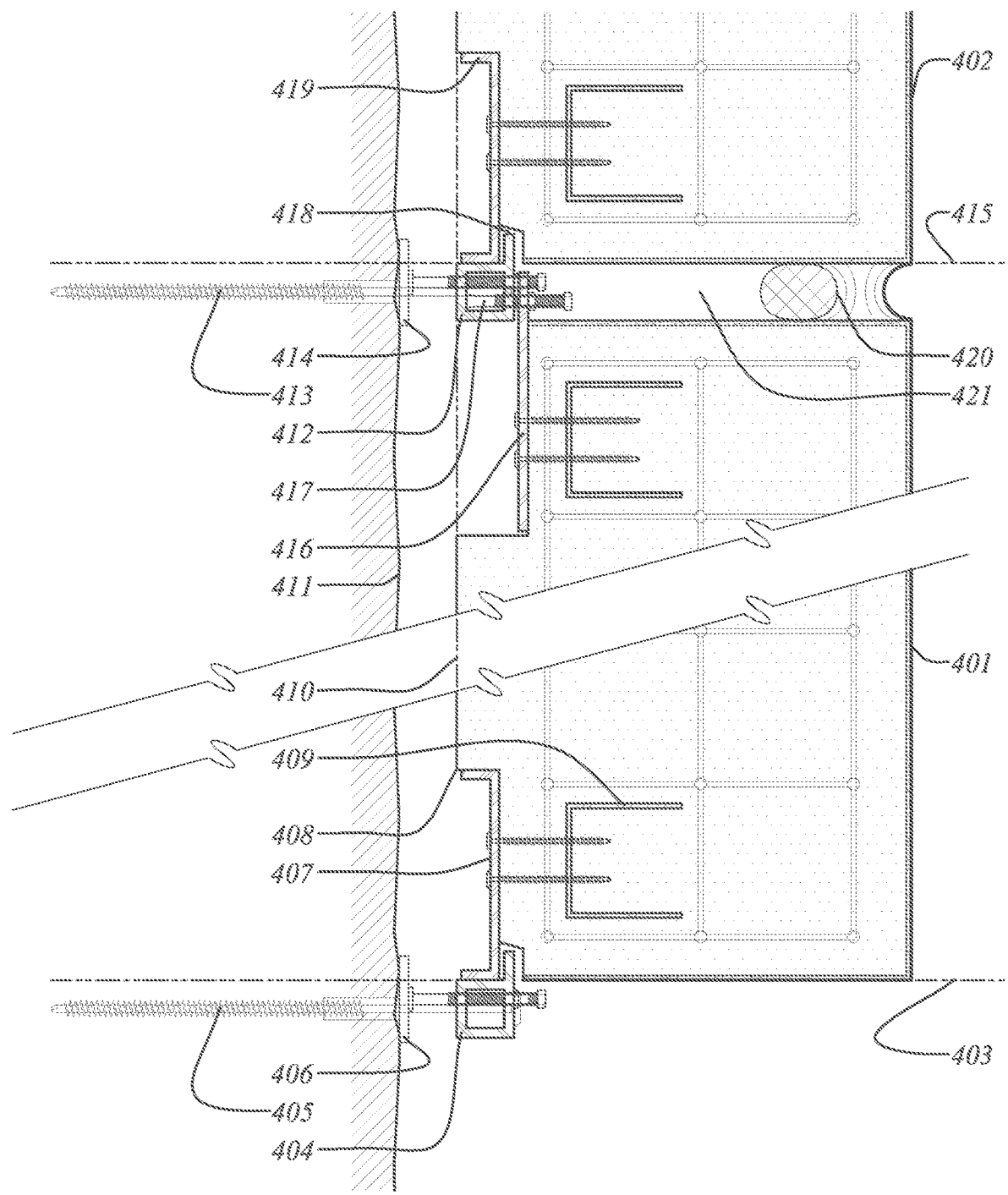
FIG. 4 is a section diagram of two panels within the system on an existing building.

FIG. 4 is a cross section of the panel system, existing building, and attachment system. Bottom rail 404 is attached to an existing building 411 with structural fastener 405 that attaches into structural elements of the existing building. The depth adjustment fastener 406 has a plate resting against the existing building substrate with a bolt that may be rotated and set to a given depth to set panel back datum 410. The structural fastener 405 and adjustment fastener 406 are adjusted until the bottom rail is set at the proper height for the panel bottom datum 403 and depth of panel back datum 410. Bottom panel 401 is then installed by panel bottom bracket 407 into bottom rail 404. Bottom panel 401 is tripped and hoisted off the truck by upper rail 412 that is loosely attached to top bracket 416. Upper rail 412 is attached to existing building 411 with structural fastener 413 and adjustment fastener 414. Upper rail's 412 height is set to top panel's 402 bottom datum 415. Depth of upper rail 412 is set by adjusting structural fastener 413 and adjustment fastener 414 until top rail 412 is at the panel back datum 410. Top of panel bracket 416 is then adjusted for depth by depth adjustment fastener 417. Panel bottom bracket 407 carries the panel gravity load and sets the system heights and depths, panel top bracket 416 carries the lateral loads and sets the top of panel depth from existing building 411. Once the bottom panel 401 has been secured, rails adjusted, and set, upper panel 402 is set by bottom bracket 419 and supports the gravity load of upper panel 402. Panel gap 418 sets the height and depth of upper panel 402 to the proper panel back datum 410 and upper panel bottom datum 415. Joint 421 is formed by the spacing between the top of bottom panel 401 and the bottom of upper panel 402. Backer rod and sealant 421 may be used to seal joint 421.

Figure 5:
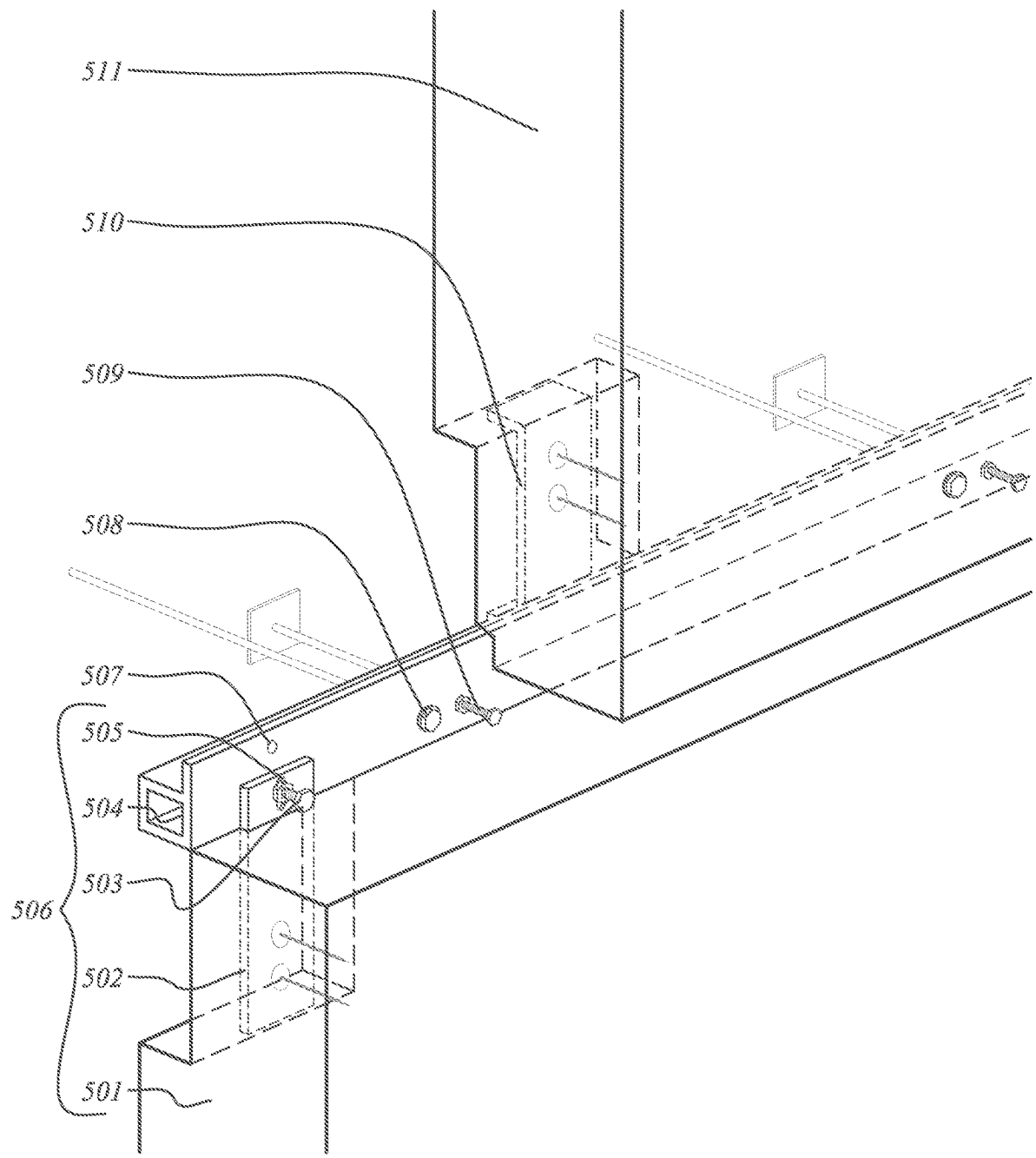
FIG. 5 is an axonometric view of panels with attachment hardware of the system.

FIG. 5 illustrates an axonometric view of a panel and attachment assembly. Panel 501 is attached to panel top bracket 502. Panel top bracket 502 is loosely attached by adjustable fastener 503 to upper rail 504 through slotted hole 505. Components 501-505 comprise assembly 506 that are all lifted as an assembly via lifting point 507 into position on an existing building and then attached to the building at the panel spaced height with structural fastener 508 and adjustment fastener 509. The depth and height of upper rail 504 sets the location for panel 511 to be installed later. Adjustable fastener 503 is adjusted to set the panel back datum for panel 501 to the proper depth and is the lower panel 501 lateral connection. Once all adjustments are made, upper panel 511 is set with panel lower bracket 510 onto rail 504 and this acts as the gravity connection for panel 511. The system repeats itself as panels are installed sequentially up the face of the building. There may be a plurality of structural fasteners 508 and adjustment fasteners 509 to attach the panel system into the existing structure of the building. Alternatively the system may be designed for all the gravity loads of the panels to transfer from panel to panel to the ground plane or structural plinth at the bottom of the lowest panel. The fastener system would then merely be lateral connections into the existing building.

Figure 6:
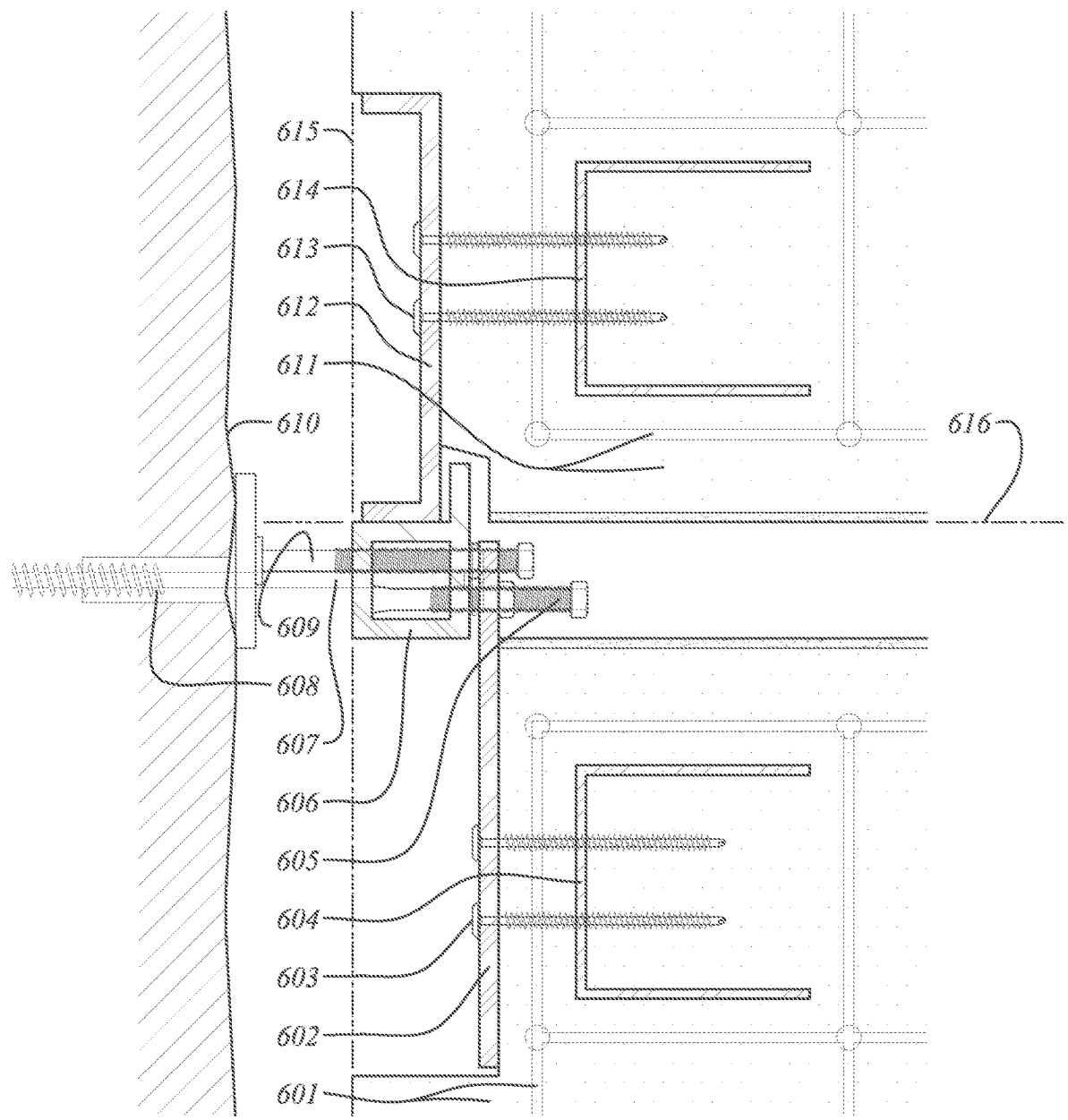
FIG. 6 is an enlarged section diagram of one embodiment of the hardware system at a joint.

FIG. 6 is an enlarged cross section of panels and attachment assembly. Panel 601 is attached to panel top bracket 602 via fasteners 603 which may be attached to embedded channel 604. Embedded channel 604 may be integrated into the 3D printing process as the cellular matrix is printed and foamed in place during the infilling process. This can create an integral fastening location to attach engineered fasteners into panel 601. Panel top bracket 602 is loosely attached by adjustable fastener 605 to upper rail 606. Upper rail 606 is attached to existing building 610 with structural fastener 607 and adjustment fastener 609. Structural fastener 607 may also have an embedded collar 608 integrated into existing building 610 which may provide additional structural support of the fastener. The depth and height of upper rail 606 sets the location for panel 611 to be installed later. Adjustable fastener 609 is adjusted to set the panel back datum for panel 601 to the proper depth and is the lower panel 601 lateral connection. Once all adjustments are made, upper panel 611 is set with panel lower bracket 612 onto rail 606 and this acts as the gravity connection for panel 611. Panel lower bracket 612 is attached to panel 611 with fasteners 613 into embedded channel 614. Embedded channel 614 may be integrated into the 3D printing process as the cellular matrix is printed and foamed in place during the infilling process. This can create an integral fastening location to attach engineered fasteners into panel 611. The system may be installed with an alignment to a panel back datum 615 and panel bottom datum 616. With this system each panel size may set the installation location of sequentially installed panels such that no measurements are needed to place further rails. The mirroring of the existing building features into the back of panels 601 and 611 may fit like a puzzle onto existing building 610.

If desired, vertical drainage planes may be milled into the back of panels such that there are vertical strips of the panels which conform to the geometry of the existing building but there is a space where moisture and water may freely drain between the existing building and the back of this panel system. Alternatively the entire system may be spaced away from the existing building at enough of an interval that water and moisture may freely flow between the existing building and this panel system.

Figure 7:
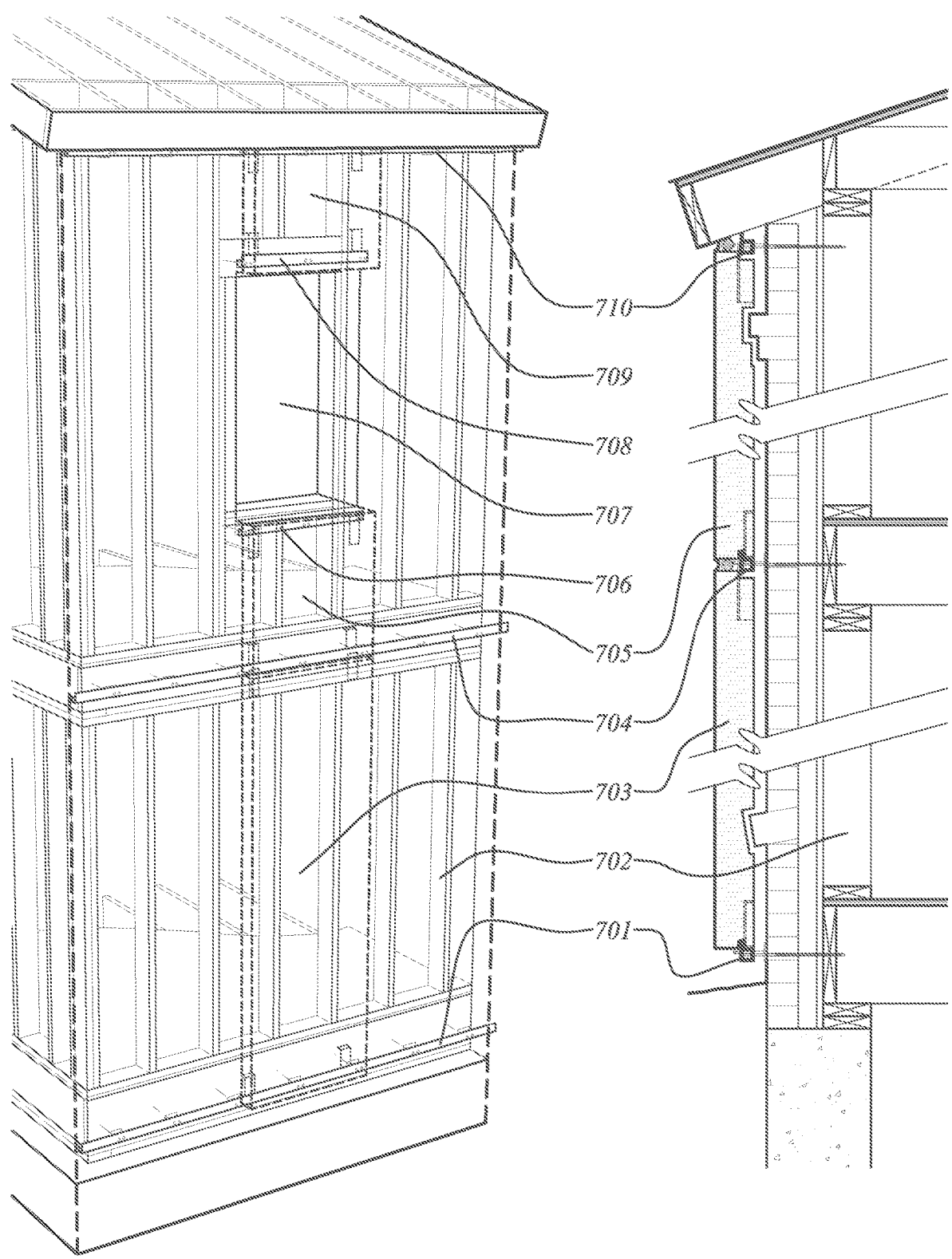
FIG. 7 is a perspective and wall section diagram illustrating how the panel system may structurally attach to an existing building.

FIG. 7 is an illustration of typical wood or light gauge framing members used to construct buildings along with the system of wall panels and rails to attach to an existing building. Bottom rail 701 is attached to the structure of existing building 702 at intervals and appropriate locations to transfer the loads of the panel system into the existing building structure. Wall panel 703 is attached to rail 701 and upper rail 704. Rail 704 is attached back to building 702. Panel 705 is then attached to rail 704 and window sill rail 706 below window 707. Window head rail 708 is attached to existing building 702 and panel 709 is attached to rail 708 and rail 710. The system of rails may be installed with each vertical row of panels or may be installed before any panels are installed. Alternatively, one vertical row of panels may be set that create the panel bottom datums for all adjacent panels to be installed later and rails for the entire face or building may be set from the first panel row's height.

The existing building exterior finish is not illustrated in the perspective diagram and may be any of the plurality of building finishes used to construct buildings such as brick, stone, wood siding, block, vinyl siding, concrete, or any other materials used as the exterior finish material of buildings.

Figure 8:
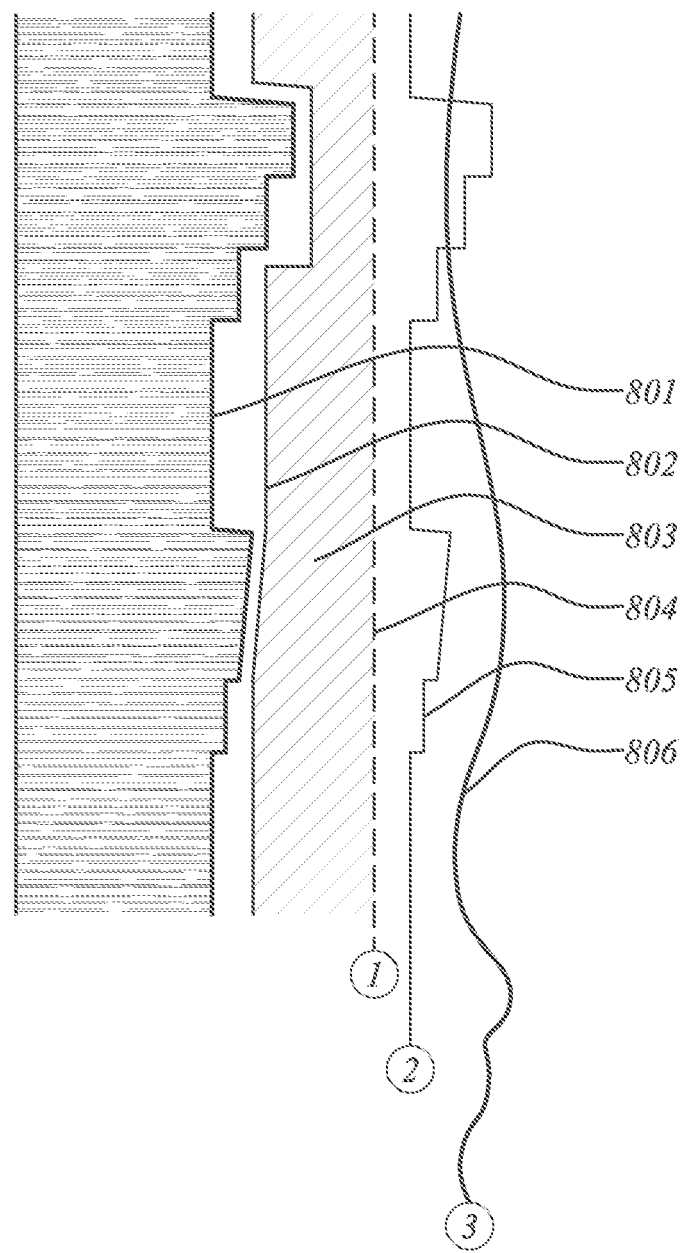
FIG. 8 is a simplified building section illustrating a plurality of options for the panel system feature face.

FIG. 8 is a wall section illustrating three exemplary options that may be used for the new feature face of the wall system. Existing building 801 has a certain feature face which may undulate or have features which deviate from a vertical plane. Back of wall system 802 may directly reflect the existing building face or may create gaps around certain features but generally conforms to the face of existing building 801. Wall panel system 803 may have a feature face 804 which is a vertical plane. Alternatively wall panel system 803 may directly translate the existing building feature face onto the panel system feature face 805 or may be a completely new designed feature face 806 to give the existing building an updated or entirely different appearance.

Figure 9:
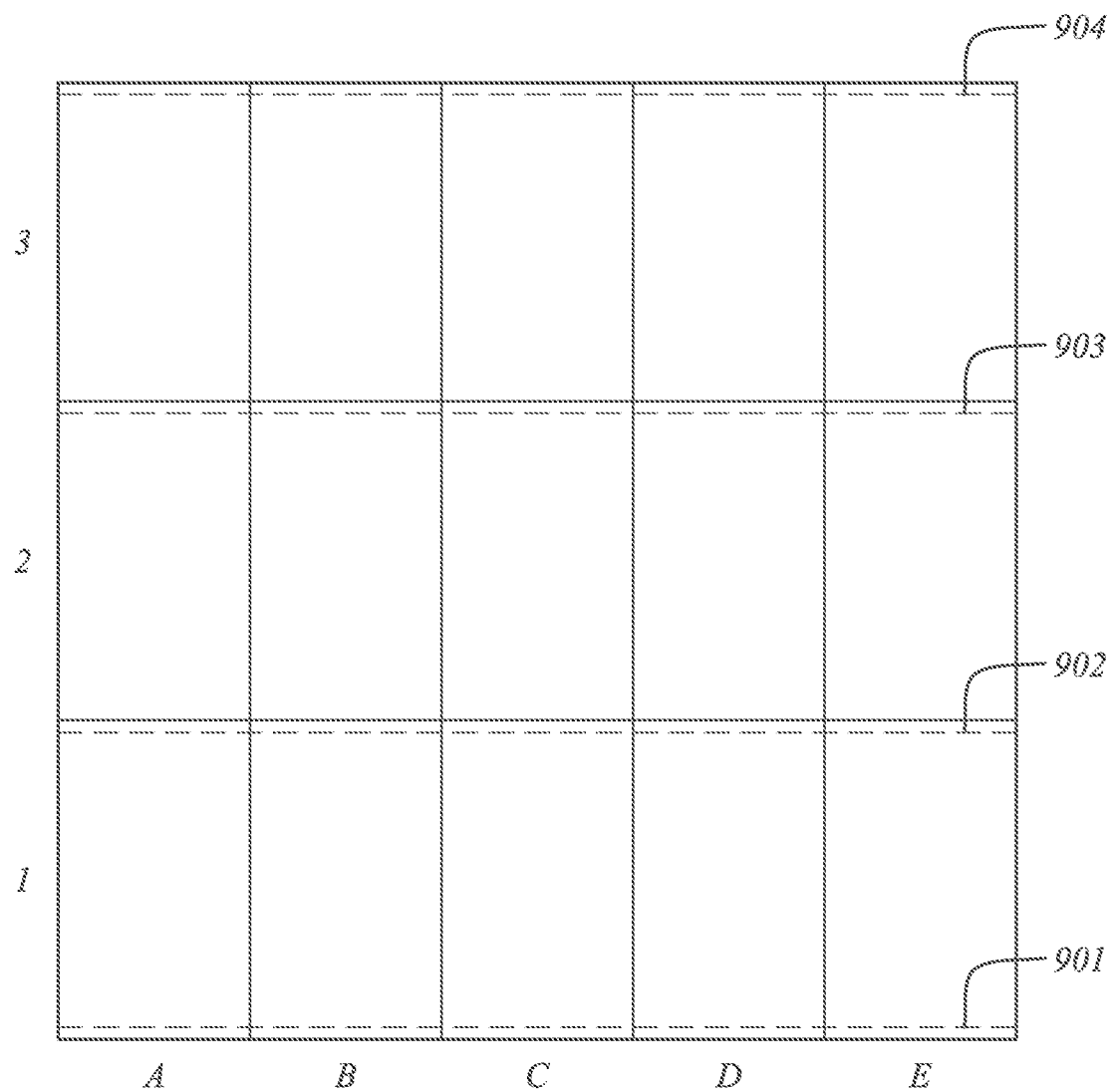
FIG. 9 is an elevation view of a simplified building panel system with rows and columns of panels.

FIG. 9 illustrates a standard wall assembly with rows and columns of the wall panel system. The sequence of installation may progress in a manner where attachment rail 901 is installed at the bottom of row 1, then panel A-1 may be installed first with attachment rail 902 being installed with panel A-1. Subsequent install steps could have panels B-1, C-1, D-1, and E-1 installed to complete row 1 and attachment rail 902. Once row 1 is installed, row 2 can commence in a similar sequence A-2, B-2 . . . . E-2, until row 2 is complete and attachment rail 903 is in place. Row 3 and subsequent rows may be completed in a similar sequence. Panels may also be installed out of sequence. An advantage of the illustrated method reduces or eliminates the need for measuring and installing components prior to the installation of the panels themselves which greatly reduces the installation labor, time, and equipment needed on a building site.

Figure 10:
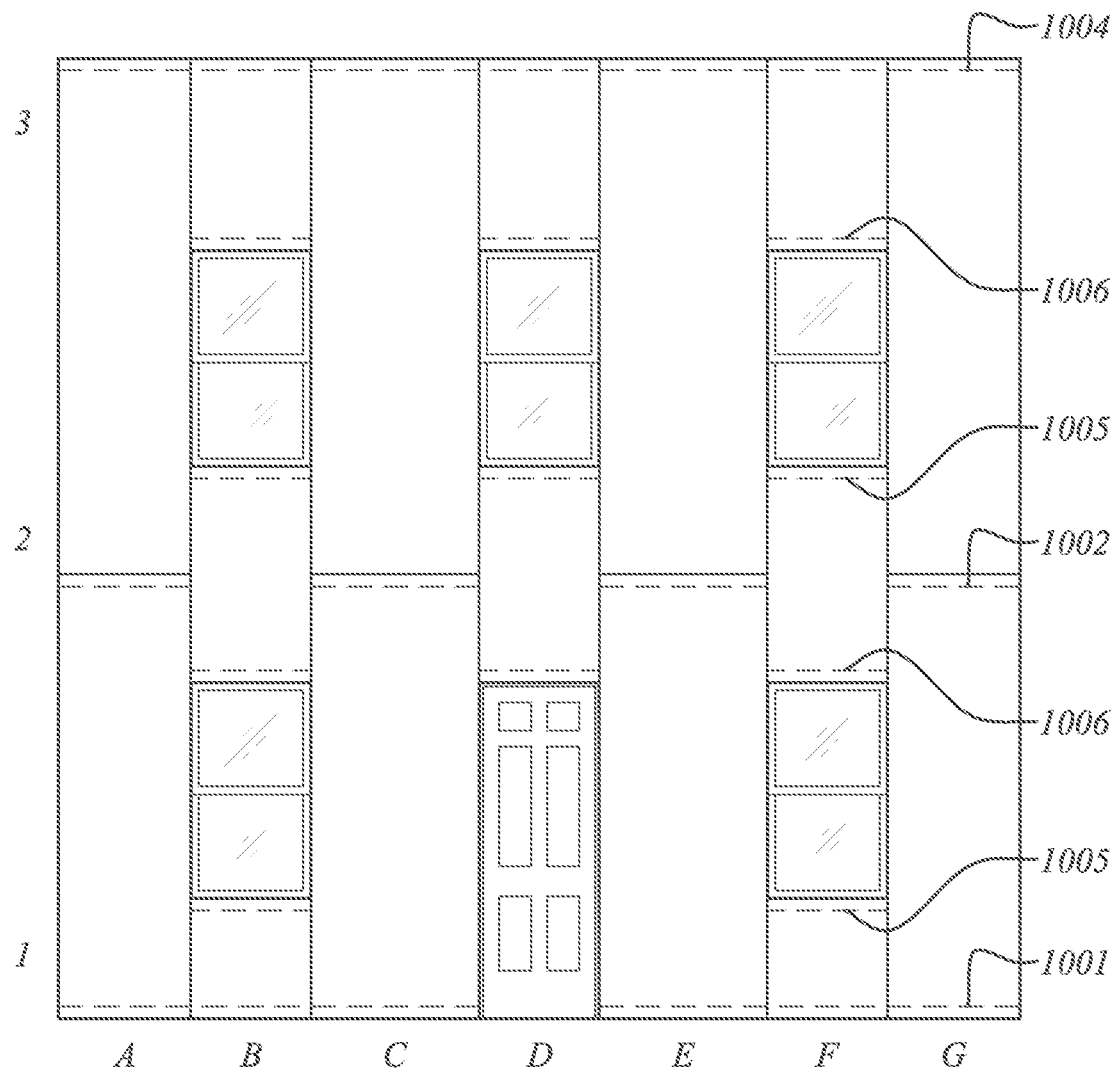
FIG. 10 is an elevation view of a building with door and window openings and a panel system with rows and columns of panels.

FIG. 10 illustrates a similar wall assembly system as FIG. 9 and has the inclusion of building apertures such as doors or windows. The sequence of installation may progress in a manner where attachment rail 1001 is installed at the bottom of row 1, then panel A-1 may be installed first with attachment rail 1002 being installed with panel A-1. Panel B-1 is installed next with attachment rail 1005. Panel C-1 is then installed. Because the door opening takes up the entire width of panel D-1, one option would be to skip to panel E-1, or an alternative could install panel D-2 to set the measurement for panel E-1. Panels continue to be installed in a similar manner to the conclusion of row 1. Row 2 represents two panel types such as panels A-2 and C-2 which span the second story and panels B-2 and D-2 which are between building openings. A similar sequential installation may be completed going from left to right through panels A-2, B-2, . . . until panel G-2 is installed. Row 3 may contain only the infill panels above the window openings at panel B-3, D-3, and F-3. Attachment rails 1005 at the window sill and attachment rails 1006 at the window or door heads may be configured slightly differently for various purposes such as to accommodate the existing building, allow for the operation of the windows or doors, or accommodate flashing or other trim pieces or panel geometry to close up the cavity between the wall panel system and the existing building.

Figure 11:
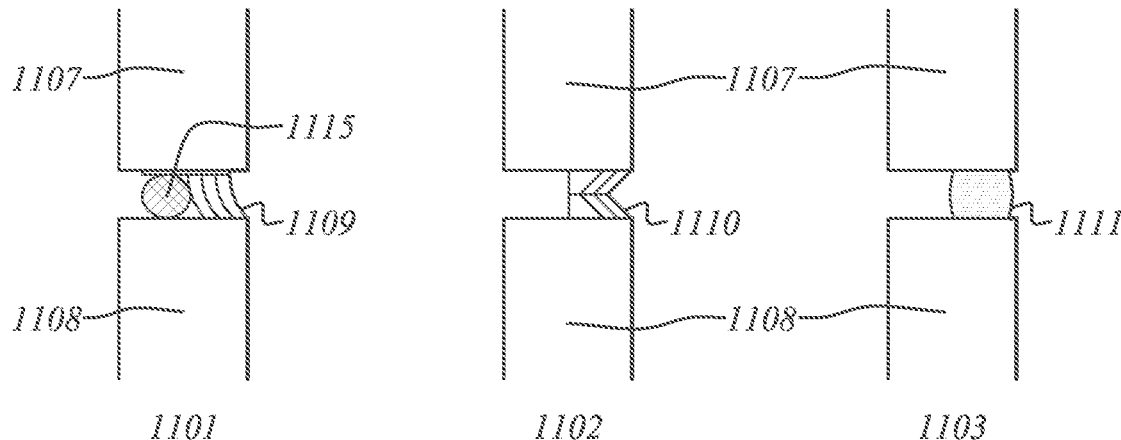
FIG. 11 is a series of panel joints showing a plurality of gasket and joint sealing options.
Figure 11:
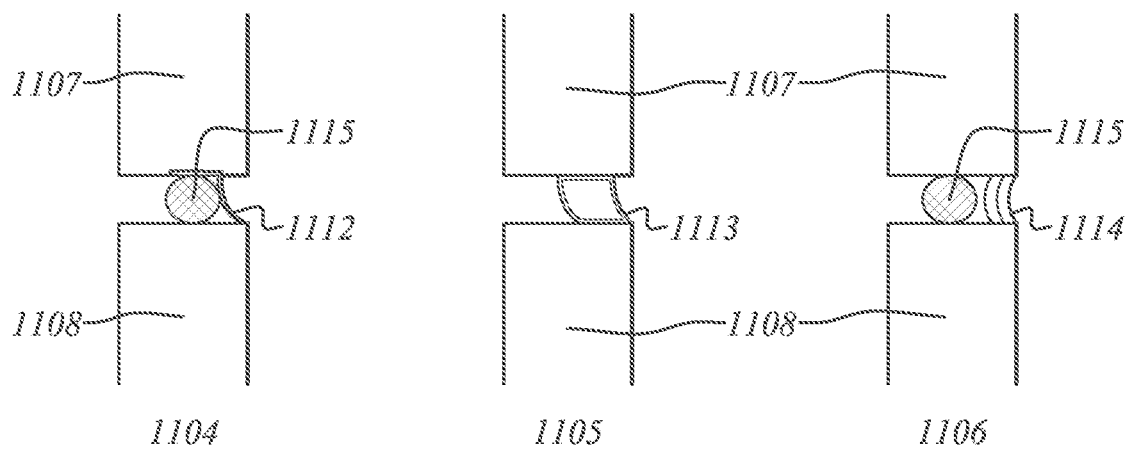

FIG. 11 illustrates several alternatives for wall system joints that include various gasket or joint sealant options. Panel system 1101 is made up of lower panel 1108 and upper panel 1107 with gasket 1109 and backer rod 1115 attached to panel 1107. As panel 1107 is lowered into place on top of panel 1108 the gasket 1109 and backer rod 1115 are compressed such that a weathertight seal is produced between the panels. Panel system 1101 may also illustrate a vertical joint, with panel 1108 in place first and panel 1107 installed subsequently such that gasket 1109 and backer rod 1115 are compressed to provide a weathertight seal between the panels. Various gasket types are illustrated in panel systems 1102, 1103, 1104, and 1105 with embedded or attachment to one panel that may be pre-installed prior to shipping or installation on the existing building. An on-site installed sealant option is illustrated in panel system 1106 where backer rod 1115 and sealant 1114 is installed between panels 1107 and 1108 after panel installation. Panel system 1106 illustrates a traditional on-site applied sealant typical to other panel systems and does not gain the advantages of prefabrication. Additional scaffolding or equipment would be necessary to gain access to the joints after installation of the panel system.

Figure 12:
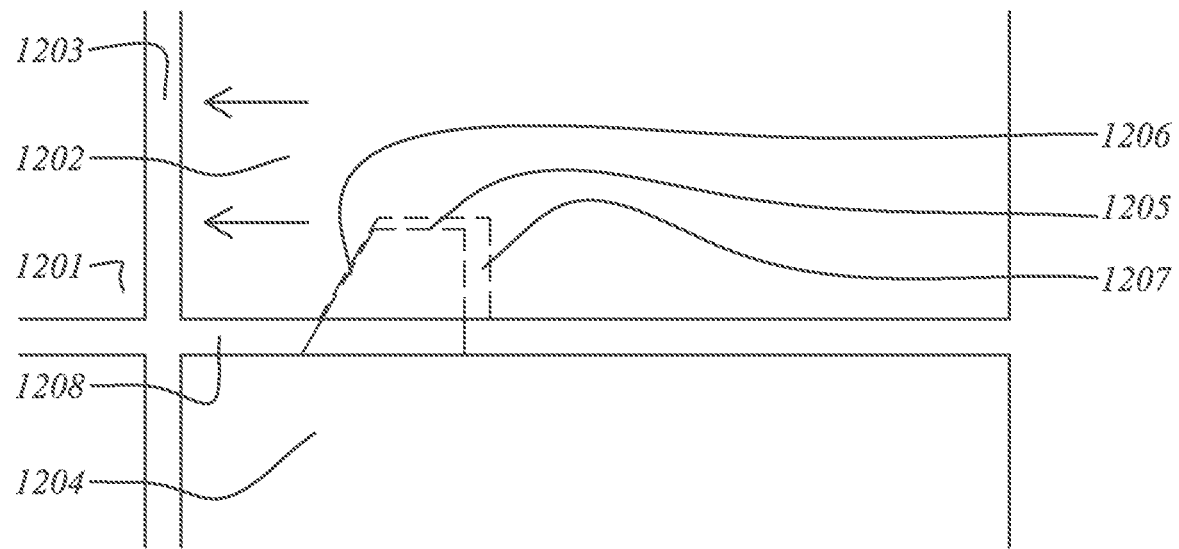
FIG. 12 is a simplified elevation view of a panel feature to compress a gasket between panels.

In some embodiments with the gasket system illustrated in FIG. 11, a system which may compress the gaskets as they are installed, e.g., as shown in FIG. 12. Panel 1201 is in place as panel 1202 is installed with joint 1203 that contains a compressible gasket. To provide lateral pressure on the gasket, panel features may be included such as panel bump-out 1205 attached to panel 1204 with sliding face 1206 at an angle. As panel 1202 is lowered into place panel pocket 1207 fits over bump-out 1205 and angled sliding face 1206 forces panel 1202 sideways to compress the gasket in joint 1203. There may be a singular or a plurality of pockets 1207 and bump-outs 1205 in order to provide proper gasket compression. The horizontal gasket joint 1208 may be compressed sufficiently by the gravity weight of panel 1202 or may include similar pockets and bump-outs on the vertical joints.

Figure 13:
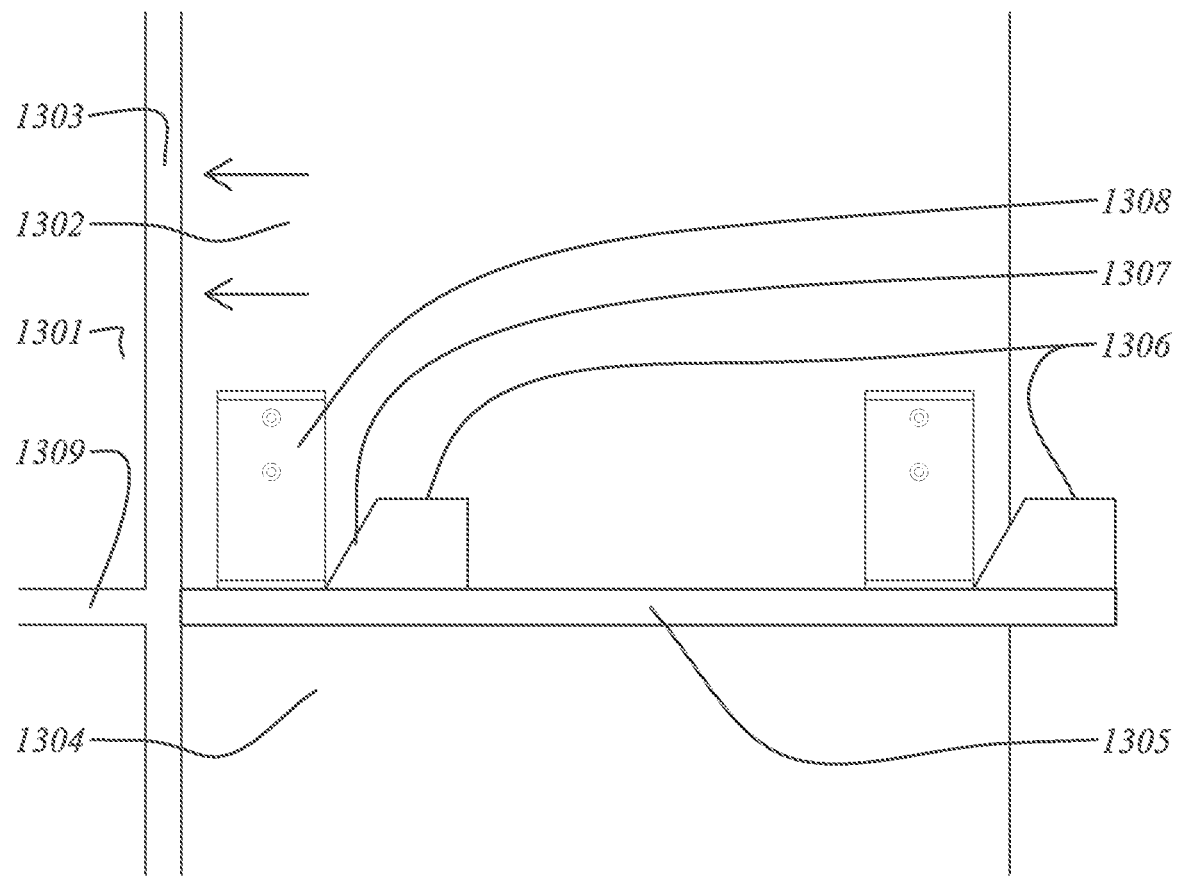
FIG. 13 is a simplified elevation view of a system hardware with features to compress a gasket between panels.

FIG. 13 illustrates a similar compression gasket outcome but the pressure points are built into the panel hardware and rails. Panel 1301 is in place as panel 1302 is installed with joint 1303 that contains a compressible gasket. To provide lateral pressure on the gasket, panel hardware may be included on attachment rail 1305 such as bump-out 1306 with sliding face 1307 at an angle. As panel 1302 is lowered into place, upper panel mounting bracket 1308 moves along angled sliding face 1307 and forces panel 1302 sideways to compress the gasket in joint 1303. There may be a singular or a plurality of bump-outs 1306 in order to provide proper gasket compression. The horizontal gasket joint 1309 may be compressed sufficiently by the gravity weight of panel 1302.

Figure 14:
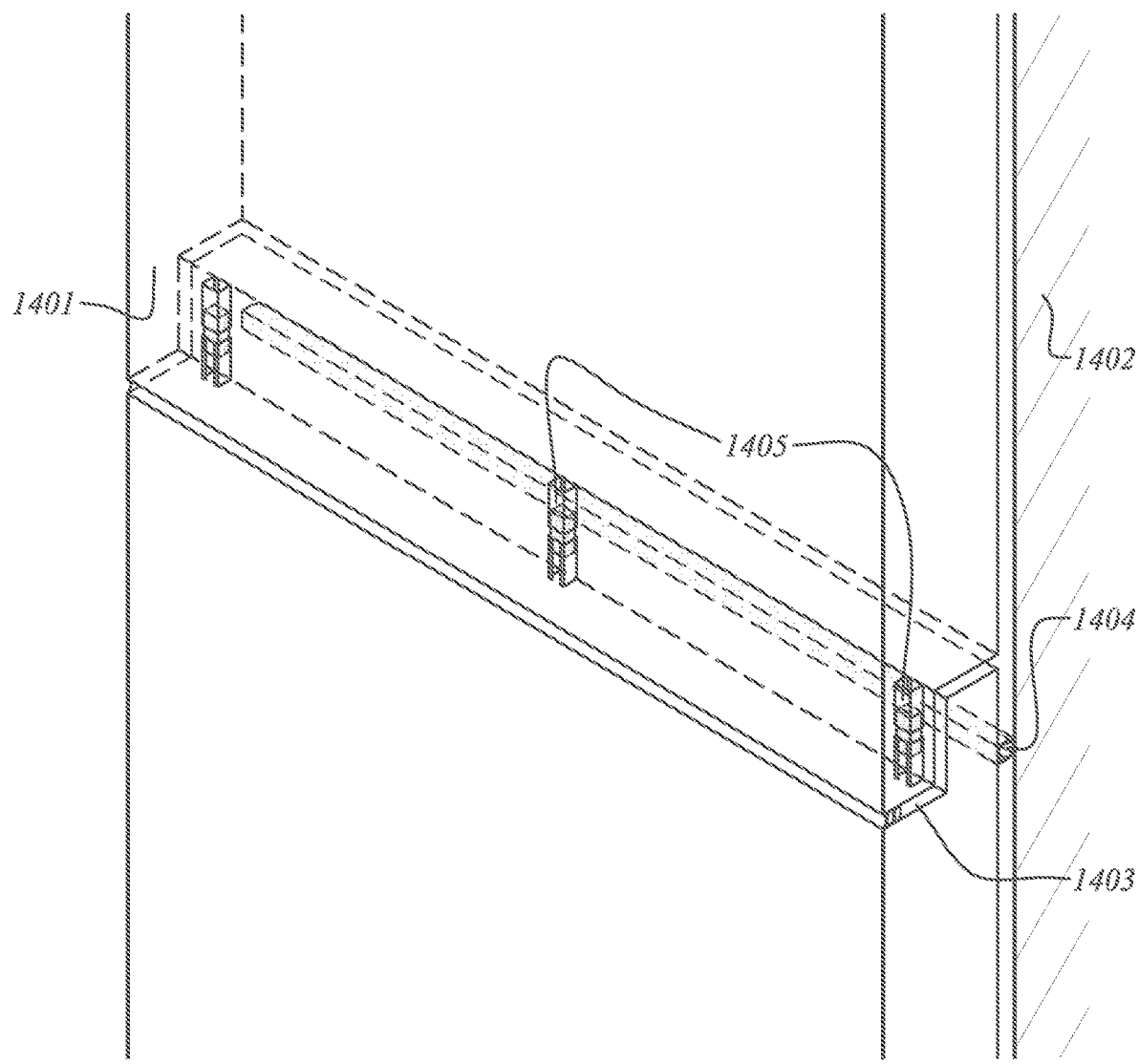
FIG. 14 is an axonometric view of two panels with a shiplap joint system.

In certain embodiments of this invention, e.g. as depicted in FIG. 14, a system of wall panels 1401 is attached to existing building 1402. The horizontal joint 1403 of this system is a shiplap joint and contains an integral hardware system 1405. Wall panels 1401 are mechanically fastened to existing building wall 1402 via mechanical fasteners in horizontal attachment rail 1404. Once the first row of panels is set and attached to the building, the next row is installed and mechanically aligned and connected to the first row using vertical clip hardware 1405 which panels share at their horizontal joint 1403.

Figure 15:
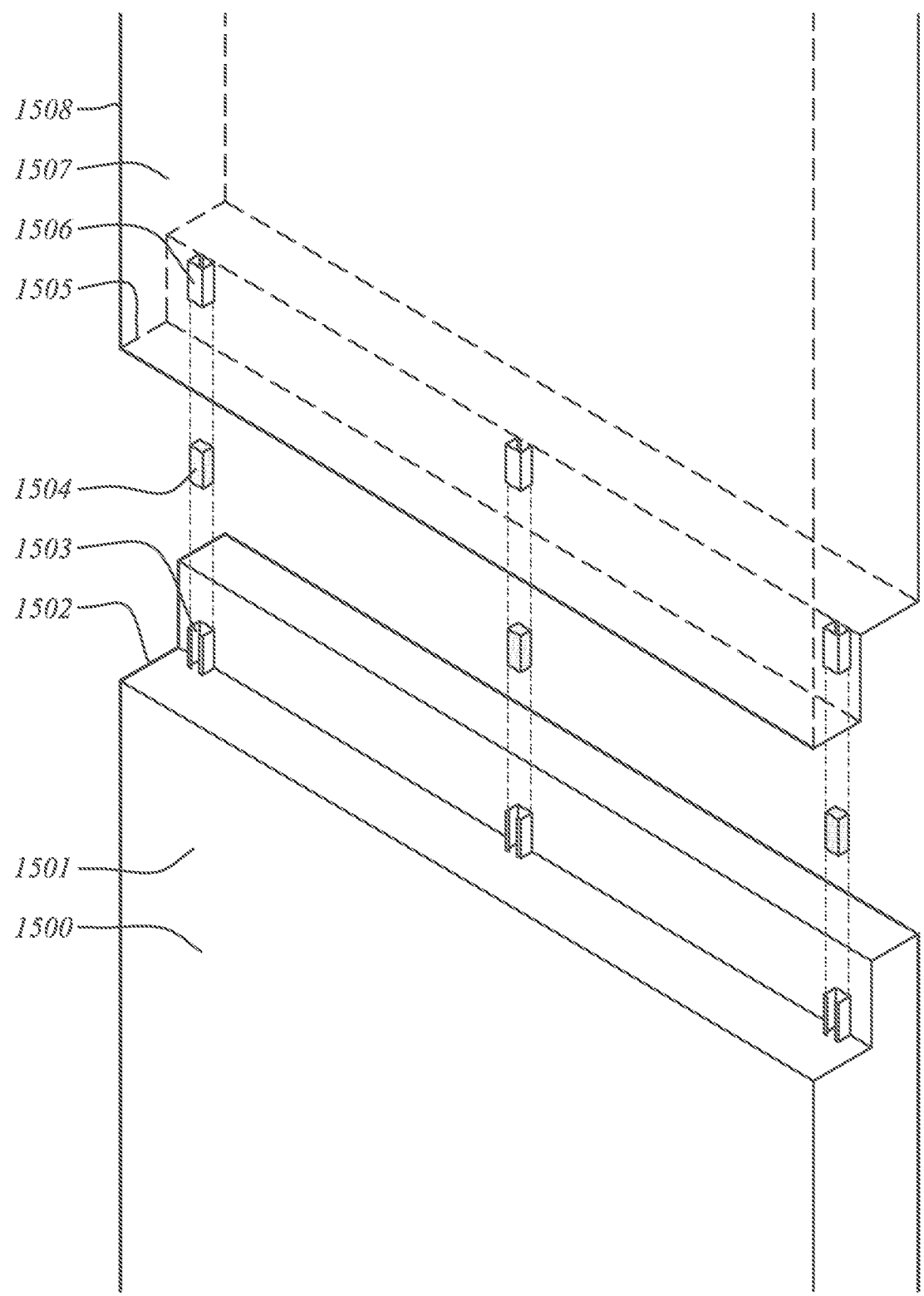
FIG. 15 is an exploded axonometric view of a joint within the shiplap joint system.

FIG. 15 shows an exploded view of a horizontal seam of the shiplap system which further illustrates the internal mechanisms. Lower panel 1501 is set with an integral clip block 1504 which can slide upward in clip track 1502. Upper panel 1508 is installed with the alignment of lower clip track 1503 and upper clip track 1506. Once upper panel 1508 and lower panel 1501 are aligned, clip block 1504 may be slid upward and fixed into place providing a mechanical connection between the panels and is the lateral connection for upper panel 1508. These interlocking components ensure proper spacing of the horizontal seam, surfaces 1502 and 1505, as well as alignment of the outer faces 1500 and 1507.

Figure 16:
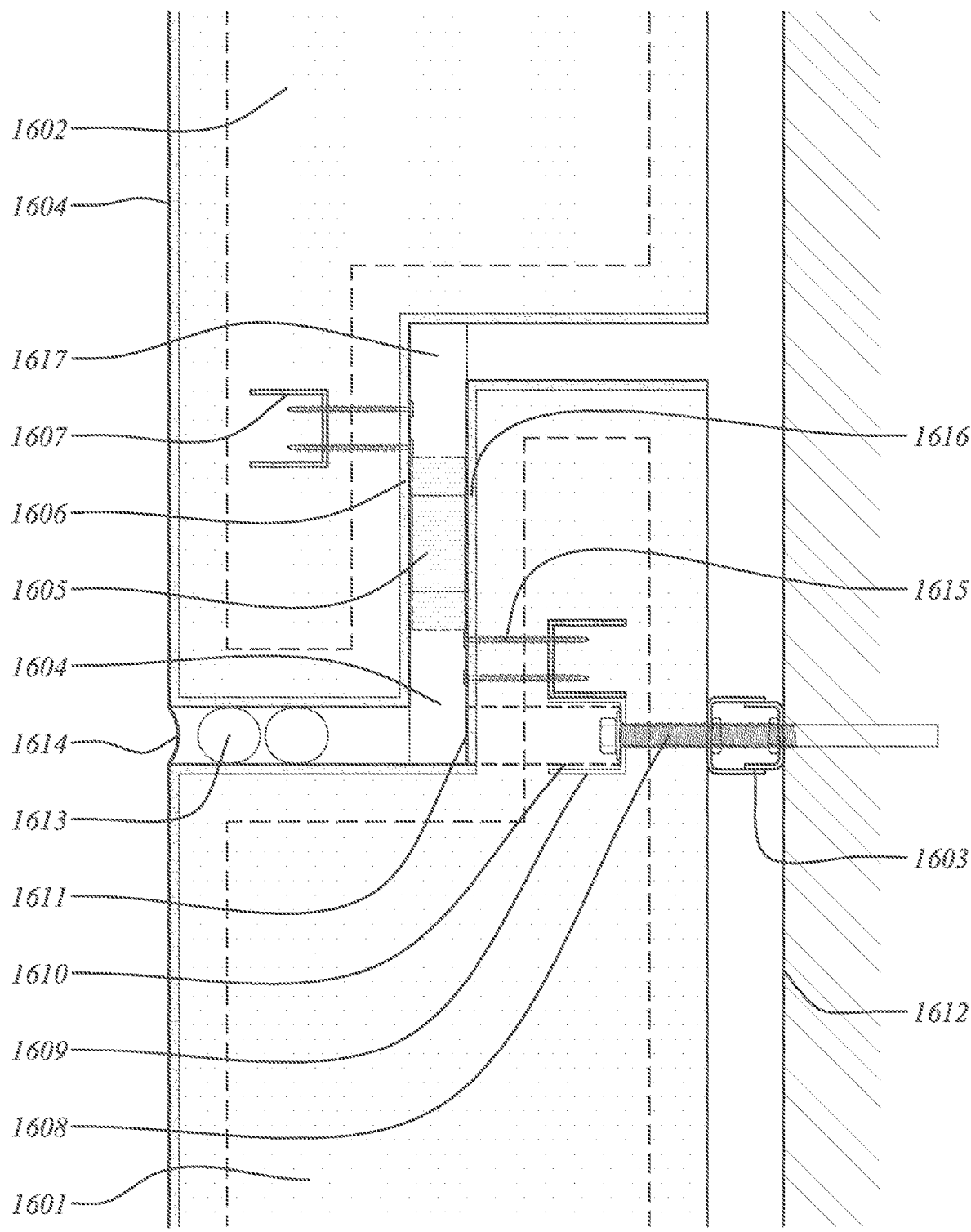
FIG. 16 is a section view of a shiplap joint system attached to an existing building.

FIG. 16 shows two installed panels at the horizontal joint. Lower panel 1601 is attached to existing building wall 1612 by mechanical fasteners 1608 into horizontal rail hardware 1603. Mechanical fastener 1608 is inserted at horizontal seam 1613, through a pilot hole 1610 in lower panel 1601 and fastened into internal hardware 1609. Internal hardware 1609 of each panel may also be mechanically fastened 1615 to rigid substrate 1616. Rigid substrate 1616 is used to ensure lower clip track 1604 and sliding clip block 1605 properly align with upper clip track 1617 in upper panel 1602. Lower panel 1601 is mechanically fastened to building wall 1612 before upper panel 1602 is placed. Backer rod 1613 and sealant 1614 may be placed in the joints once panels are installed.

Figure 17:
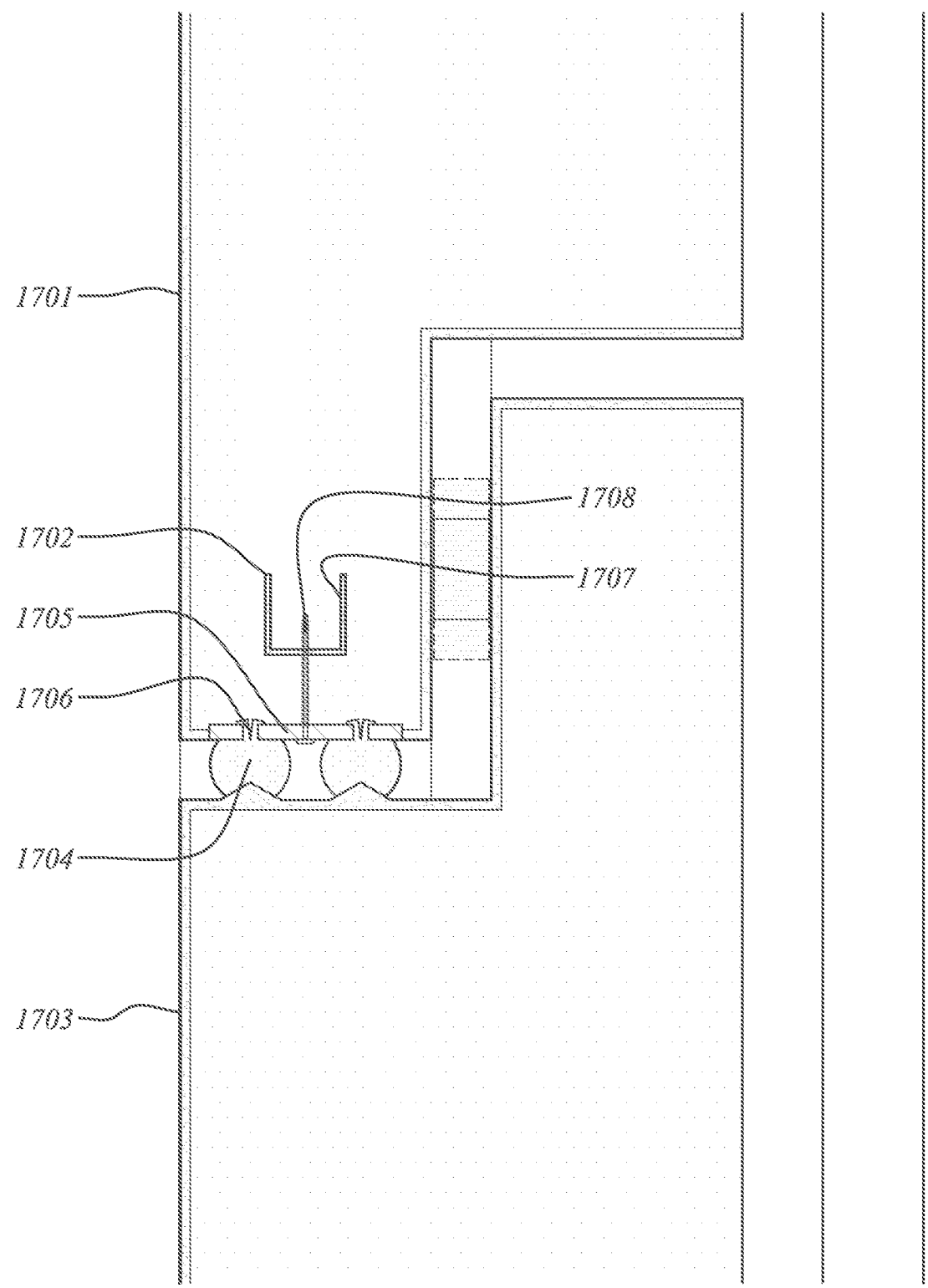
FIG. 17 is a section diagram of a shiplap joint with a gasket.

FIG. 17 illustrates another gasket assembly at panel joints. Upper panel 1701 has embedded channel 1702 that is integral to panel 1701. Double gasket 1704 may be included at each panel seam and is mechanically attached to gasket plate 1705 via push riveting mechanism 1706. Gasket plate 1705 is connected to internal hardware 1707 via mechanical fastener 1708. Double gasket 1704 may produce a weathertight seal to lower panel 1703.

Figure 18:
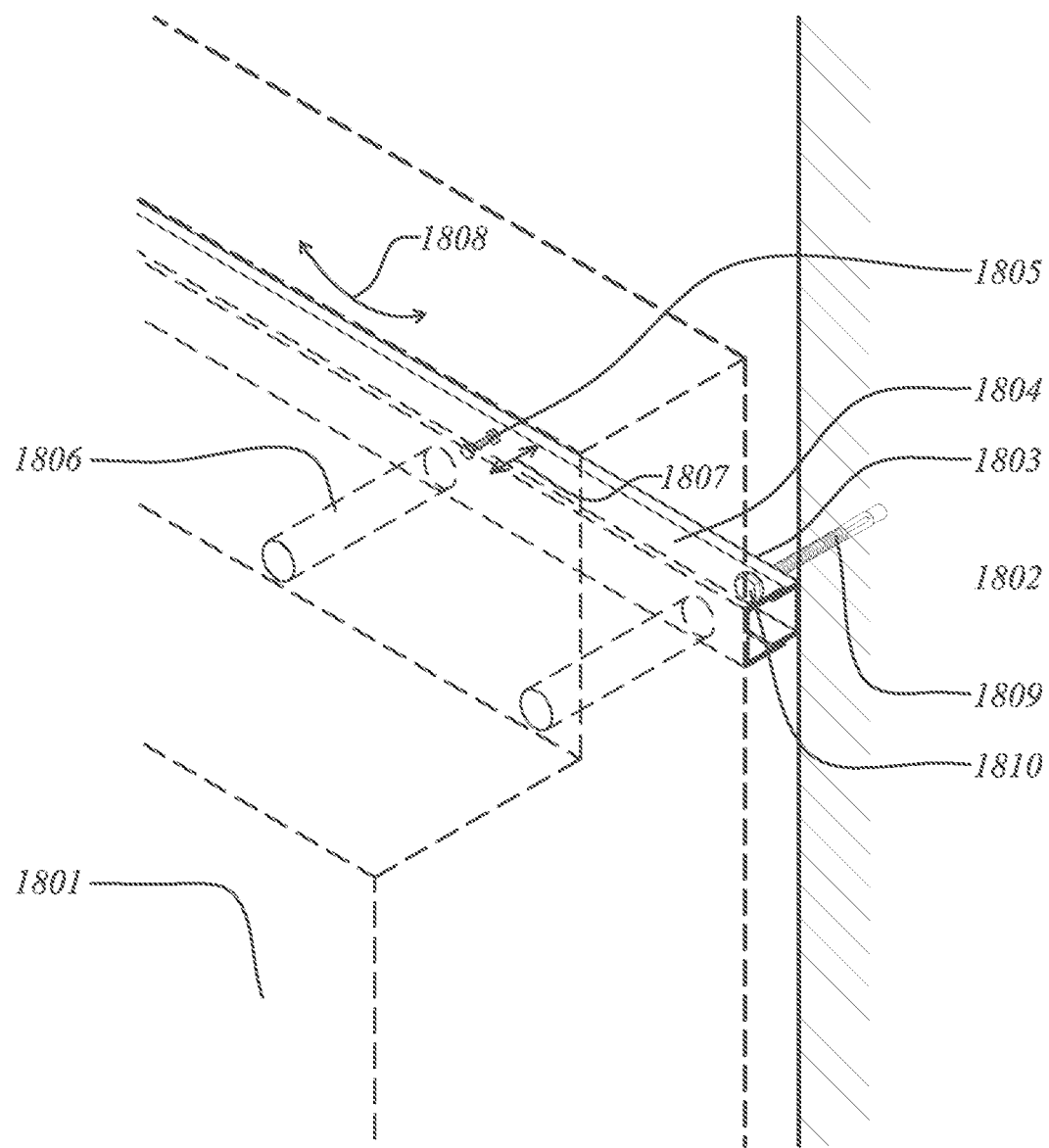
FIG. 18 is an axonometric view of a lower panel with shiplap joints and its hardware system.

FIG. 18 illustrates an enlarged axonometric view of internal hardware of lower panel 1801 at a horizontal joint and how attachment to the existing building wall 1802 may be accomplished. The horizontal attachment rail 1803 is used to attach the panel to the building wall 1802. The horizontal attachment rail 1803 is comprised of two c-channels with the smaller c-channel 1803 nesting in the larger c-channel 1804. Mechanical fastener 1809 is used to attach the system to the building wall 1802, with the head 1810 of fastener 1809 seated against the smaller c-channel 1803. A secondary mechanical fastener 1805, threaded into the larger c-channel 1804. This mechanical fastener is accessed through pilot hole 1806 and enables the two channels to move in and out 1807, perpendicular to the building wall 1802 at discrete locations. This allows for panel adjustment perpendicular to the building wall 1802 as well as rotational adjustment 1808 due to the discrete locations along a panel's width.

In the following, further examples are described to facilitate the understanding of the invention (and in some aspects, features of an apparatus or system described in one or more of these examples can be utilized in a method described in one of the other examples or vice versa):

Example 1. A method (which may incorporate features of any of the subsequent examples) of retrofitting an existing exterior of a building, the method comprising: (a) obtaining data about an exterior geometry of the existing exterior; (b) using the obtained data, defining a custom retrofit panel system for the exterior geometry; and (c) constructing the custom retrofit panel system including a plurality of panels, wherein constructing a panel comprises: (i) forming a panel frame by additive manufacturing, the panel frame defining interstitial spaces; (ii) at least partially filling the interstitial spaces with at least one filler; and (iii) wherein the constructed panel comprises a building facing surface configured to the exterior geometry of the existing exterior.

Example 2. The method of Example 1 or any of the preceding or subsequent examples, wherein forming the panel frame comprises forming a cellular matrix by freeform extrusion.

Example 3. The method of Example 2 or any of the preceding or subsequent examples, wherein the formed cellular matrix is a three-dimensional truss comprising a plurality of extruded segments connected at joints, at least some of the joints located in an interior area of the cellular matrix spaced from the exterior of the matrix and comprising extruded segments extending from those joints in at least three different directions.

Example 4. The method of Example 2 or any of the preceding or subsequent examples, wherein forming the cellular matrix comprises freeform extruding the cellular matrix using an extrusion head on a six degree of freedom robotic manipulator.

Example 5. The method of Example 1 or any of the preceding or subsequent examples, wherein the exterior geometry of the existing exterior comprises one or more protruding portions and one or more recessed portions, wherein the building facing surfaces of the constructed panels comprise recessed portions spatially corresponding to the protruding portions of the exterior geometry, and wherein the building facing surfaces of the constructed panels comprise protruding portions spatially corresponding to the recessed portions of the exterior geometry.

Example 6. The method of Example 1 or any of the preceding or subsequent examples, wherein the exterior geometry of the existing exterior comprises one or more angled portions and one or more non-angled portions, wherein the building facing surfaces of the constructed panels comprise angled portions spatially corresponding to the angled portions of the exterior geometry, and wherein the building facing surfaces of the constructed panels comprise non-angled portions spatially corresponding to the non-angled portions of the exterior geometry.

Example 7. The method of Example 1 or any of the preceding or subsequent examples, wherein the exterior geometry of the existing exterior comprises at least one window, and wherein the formed panel frame comprises at least one window opening spatially corresponding to the at least one window of the exterior geometry.

Example 8. The method of Example 1 or any of the preceding or subsequent examples, wherein at least partially filling the interstitial space with the filler comprises at least partially filling the interstitial space with an insulation material.

Example 9. The method of Example 1 or any of the preceding or subsequent examples, wherein constructing the panel further comprises applying a finish material to an exterior facing surface of the panel.

Example 10. The method of Example 1 or any of the preceding or subsequent examples, wherein constructing the panel further comprises removing excess filler after at least partially filling the interstitial space with the filler.

Example 11. The method of Example 10 or any of the preceding or subsequent examples, wherein removing excess filler comprises robotically milling the excess filler.

Example 12. The method of Example 11 or any of the preceding or subsequent examples, wherein robotically milling the excess filler comprises milling a building facing surface of the filler to a shape corresponding to the exterior geometry of the existing exterior.

Example 13. The method of Example 1 or any of the preceding or subsequent examples, wherein the building facing surface of the panel is configured to conform to the exterior geometry of the existing exterior.

Example 14. The method of Example 1 or any of the preceding or subsequent examples, wherein obtaining data about the exterior geometry of the existing exterior comprises using photogrammetry or LIDAR scanning to obtain the data.

Example 15. The method of Example 1 or any of the preceding or subsequent examples, further comprising: (i) using the obtained data to create a digital three-dimensional surface model of the exterior geometry of the existing exterior, and (ii) using the digital model to construct the custom retrofit panel system such that the building facing surfaces of the panels are configured to conform to the exterior geometry of the existing exterior.

Example 16. The method of Example 1 or any of the preceding or subsequent examples, wherein constructing the custom retrofit panel system comprises: (i) constructing a first panel having a first building facing surface configured to conform to a first portion of the exterior geometry of the existing exterior; (ii) constructing a second panel having a second building facing surface configured to conform to a second portion of the exterior geometry of the existing exterior; wherein the first building facing surface has a geometry that is different from the second building facing surface.

Example 17. The method of Example 1 or any of the preceding or subsequent examples, wherein constructing the custom retrofit panel system comprises constructing a kit of panels, wherein each panel in the kit is configured for a particular portion of the existing exterior.

Example 18. The method of Example 1 or any of the preceding or subsequent examples, wherein constructing the panel further comprises incorporating one or more connectors into the panel.

Example 19. The method of Example 18 or any of the preceding or subsequent examples, wherein the connectors are formed by additive manufacturing along with the panel frame.

Example 20. The method of Example 18 or any of the preceding or subsequent examples, wherein the connectors are secured to the panel frame after the panel frame is formed by additive manufacturing.

Example 21. The method of Example 18 or any of the preceding or subsequent examples, wherein at least some of the connectors comprise panel tripping and lift points.

Example 22. The method of Example 18 or any of the preceding or subsequent examples, wherein at least some of the connectors are configured to connect to the existing exterior of the building or building connectors attached to the existing exterior of the building.

Example 23. The method of Example 22 or any of the preceding or subsequent examples, wherein at least some of the connectors are configured to connect to rails mounted on the building.

Example 24. The method of Example 18 or any of the preceding or subsequent examples, wherein at least some of the connectors are configured to space apart adjacent panels at a pre-defined spacing.

Example 25. The method of Example 18 or any of the preceding or subsequent examples, wherein at least some of the connectors are configured to anchor adjacent panels.

Example 26. The method of Example 18 or any of the preceding or subsequent examples, wherein at least some of the connectors are configured to insulate gaps between adjacent panels or between the panel and the existing exterior of the building.

Example 27. The method of Example 18 or any of the preceding or subsequent examples, wherein the panels are configured to allow access to the connectors after installation, for removal and replacement of a panel.

Example 28. A manufacturing system configured to perform the method of any of Examples 1-27 or any of the subsequent examples.

Example 29. A custom retrofit panel system manufactured using the method of any of Examples 1-27 or any of the subsequent examples.

Example 30. A panel manufactured using the method of any of Examples 1-27 or any of the subsequent examples.

Example 31. A custom retrofit panel system (which may incorporate features of any of the preceding or subsequent examples) configured to retrofit an existing exterior of a building, the custom retrofit panel system comprising: a plurality of panels, each panel comprising: a panel frame comprising a three-dimensional cellular matrix structure defining interstitial spaces; at least one filler arranged at least partially within the interstitial spaces; a building facing surface configured to mate with at least a portion of an exterior geometry of the existing exterior, wherein the building facing surface comprises a shape based on data obtained about the existing exterior; and at least one connector coupleable to a portion of the existing exterior.

Example 32. The custom retrofit panel system of Example 31 or any of the preceding or subsequent examples, wherein the three-dimensional cellular matrix is a three-dimensional truss comprising a plurality of extruded segments connected at joints, at least some of the joints located in an interior area of the cellular matrix spaced from the exterior of the matrix and comprising extruded segments extending from those joints in at least three different directions.

Example 33. The custom retrofit panel system of Example 31 or any of the preceding or subsequent examples, wherein the building facing surface of the panel is configured to conform to the exterior geometry of the existing exterior.

Example 34. The custom retrofit panel system of Example 31 or any of the preceding or subsequent examples, wherein the at least one connector is coupleable to at least one rail mounted on the existing exterior.

Example 35. The custom retrofit panel system of Example 31 or any of the preceding or subsequent examples, wherein the at least one connector is configured to space apart adjacent panels of the plurality of panels at a pre-defined spacing on the existing exterior.

Example 36. A building exterior retrofitting system (which may incorporate features of any of the preceding or subsequent examples) comprising: a scanning device configured to obtain data about an exterior geometry of the existing exterior; a processor configured to, using the obtained data, define a custom retrofit panel system for the exterior geometry; and an additive manufacturing device configured to construct the custom retrofit panel system including a plurality of panels, each panel of the plurality of panels comprising a panel frame formed by additive manufacturing and defining interstitial spaces, at least one filler at least partially filling the interstitial spaces, and a building facing surface configured to mate with at least a portion of the exterior geometry of the existing exterior.

Example 37. The building exterior retrofitting system of Example 36 or any of the preceding or subsequent examples, wherein the panel frame comprises a three-dimensional cellular matrix that is a three-dimensional truss comprising a plurality of extruded segments connected at joints, at least some of the joints located in an interior area of the cellular matrix spaced from the exterior of the matrix and comprising extruded segments extending from those joints in at least three different directions.

Example 38. The building exterior retrofitting system of Example 36 or any of the preceding or subsequent examples, wherein the building facing surface of the panel is configured to conform to the exterior geometry of the existing exterior.

Example 39. The building exterior retrofitting system of Example 36 or any of the preceding or subsequent examples, wherein the at least one connector is coupleable to at least one rail mounted on the existing exterior.

Example 40. The building exterior retrofitting system of Example 36 or any of the preceding examples, wherein the at least one connector is configured to space apart adjacent panels of the plurality of panels at a pre-defined spacing on the existing exterior.

Different arrangements of the components and activities depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

That which is claimed is:

1. A building exterior retrofitting system comprising:
   a scanning device configured to obtain data about an exterior geometry of an existing exterior;
   a processor configured to, using the obtained data, define a custom retrofit panel system for the exterior geometry; and
   a freeform additive manufacturing device configured to construct the custom retrofit panel system; and
   a plurality of panels of the custom retrofit panel system, each panel of the plurality of panels comprising (i) a panel frame comprising a three-dimensional cellular matrix formed by additive manufacturing and defining interstitial spaces, (ii) at least one filler formed by additive manufacturing and at least partially filling the interstitial spaces, and (iii) a building facing surface, wherein at least a portion of the exterior geometry of the existing exterior comprises a building surface of the existing exterior, and the building facing surface is configured to mate with the building surface.

2. The building exterior retrofitting system of claim 1, wherein the three-dimensional cellular matrix is a three-dimensional truss comprising a plurality of extruded segments connected at joints, at least some of the joints located in an interior area of the cellular matrix spaced from the exterior of the matrix and comprising extruded segments extending from those joints in at least three different directions.

3. The building exterior retrofitting system of claim 1, wherein the plurality of panels comprises a first panel comprising a first building facing surface comprising a first geometry configured to mate with a first portion of the building surface and a second panel comprising a second building facing surface comprising a second geometry configured to mate with a second portion of the building surface, the first geometry being different from the second geometry.

4. The building exterior retrofitting system of claim 1, wherein the custom retrofit panel system comprises at least one connector coupleable to at least one rail mounted on the existing exterior.

5. The building exterior retrofitting system of claim 1, wherein the custom retrofit panel system comprises at least one connector configured to space apart adjacent panels of the plurality of panels at a pre-defined spacing on the existing exterior.

6. The building exterior retrofitting system of claim 1, wherein the exterior geometry of the existing exterior comprises one or more protruding portions, wherein the building facing surfaces of the constructed panels comprise recessed portions spatially corresponding to the protruding portions of the exterior geometry.

7. The building exterior retrofitting system of claim 1, wherein the exterior geometry of the existing exterior comprises one or more recessed portions, wherein the building facing surfaces of the constructed panels comprise protruding portions spatially corresponding to the recessed portions of the exterior geometry.

8. The building exterior retrofitting system of claim 1, wherein the exterior geometry of the existing exterior comprises one or more angled portions, wherein the building facing surfaces of the constructed panels comprise angled portions spatially corresponding to the angled portions of the exterior geometry.

9. The building exterior retrofitting system of claim 1, wherein the custom retrofit panel system comprises at least one connector formed by additive manufacturing along with the panel frame.

10. The building exterior retrofitting system of claim 1, wherein the custom retrofit panel system comprises at least one connector comprising panel tripping and lift points.

* * * * *